(12) United States Patent
Matsubara et al.

(10) Patent No.: US 12,148,593 B2
(45) Date of Patent: Nov. 19, 2024

(54) ION BEAM DEVICE

(71) Applicant: Hitachi High-Tech Corporation, Tokyo (JP)

(72) Inventors: Shinichi Matsubara, Tokyo (JP); Masami Ikota, Tokyo (JP)

(73) Assignee: Hitachi High-Tech Corporation, Tokyo (JP)

( * ) Notice: Subject to any disclaimer, the term of this patent is extended or adjusted under 35 U.S.C. 154(b) by 393 days.

(21) Appl. No.: 17/635,836

(22) PCT Filed: Sep. 17, 2019

(86) PCT No.: PCT/JP2019/036260
§ 371 (c)(1),
(2) Date: Feb. 16, 2022

(87) PCT Pub. No.: WO2021/053704
PCT Pub. Date: Mar. 25, 2021

(65) Prior Publication Data
US 2022/0301812 A1    Sep. 22, 2022

(51) Int. Cl.
*H01J 37/22*    (2006.01)
*H01J 37/244*    (2006.01)
(Continued)

(52) U.S. Cl.
CPC .......... *H01J 37/222* (2013.01); *H01J 37/244* (2013.01); *H01J 37/28* (2013.01); *H01J 37/31* (2013.01);
(Continued)

(58) Field of Classification Search
None
See application file for complete search history.

(56) References Cited

U.S. PATENT DOCUMENTS 5,798,529 A * 8/1998 Wagner ............... G01B 15/04
850/10
2004/0041095 A1* 3/2004 Nasser-Ghodsi ... H01J 37/3056
250/310
(Continued)

FOREIGN PATENT DOCUMENTS

JP        85146062 A    4/1976
JP      2005108100 A    4/2005
(Continued)

OTHER PUBLICATIONS

Office Action mailed Jun. 9, 2021 in Taiwanese Application No. 109123847.
(Continued)

*Primary Examiner* — Eliza W Osenbaugh-Stewart
(74) *Attorney, Agent, or Firm* — Miles & Stockbridge, P.C.

(57) ABSTRACT

An object of the invention is to provide an ion beam device that can measure structures existing at different positions in a thickness direction of a sample. The ion beam device according to the invention irradiates a sample with an ion beam obtained by ionizing elements contained in a gas. After obtaining a first observation image of a first shape of a first region using a first ion beam, the ion beam device processes a hole in a second region of the sample using a second ion beam, and uses the first ion beam on the processed hole to obtain a second observation image of a second shape of the second region. By comparing the first observation image and the second observation image, a relative positional relation between the first shape and the second shape is obtained (refer to FIG. 7C).

14 Claims, 17 Drawing Sheets

(51) Int. Cl.
  *H01J 37/28* (2006.01)
  *H01J 37/305* (2006.01)
  *H01J 37/31* (2006.01)
(52) U.S. Cl.
  CPC .......... *H01J 2237/0216* (2013.01); *H01J 2237/2448* (2013.01); *H01J 2237/24578* (2013.01); *H01J 2237/30466* (2013.01); *H01J 2237/31749* (2013.01)

(56) References Cited

U.S. PATENT DOCUMENTS

| | | | |
|---|---|---|---|
| 2009/0200484 A1* | 8/2009 | Frosien | H01J 37/243 250/396 R |
| 2010/0176296 A1 | 7/2010 | Kaito et al. | |
| 2011/0063431 A1 | 3/2011 | Kiyohara et al. | |
| 2016/0350614 A1 | 12/2016 | Warschauer | |
| 2018/0277361 A1 | 9/2018 | Routh, Jr. et al. | |

FOREIGN PATENT DOCUMENTS

| | | |
|---|---|---|
| JP | 201186606 A | 4/2011 |
| JP | 2015167141 A | 9/2015 |
| JP | 2015204181 A | 11/2015 |
| JP | 201721006 A | 1/2017 |
| TW | 200926245 A | 6/2009 |
| TW | 201717245 A | 5/2017 |
| TW | 201734235 A | 10/2017 |
| WO | 2007067310 A2 | 6/2007 |
| WO | 2009020150 A1 | 2/2009 |

OTHER PUBLICATIONS

Search Report mailed Nov. 26, 2019 in International Application No. PCT/JP2019/036260.

Written Opinion mailed Nov. 26, 2019 in International Application No. PCT/JP2019/036260.

\* cited by examiner

ION BEAM DEVICE

TECHNICAL FIELD

The present invention relates to an ion beam device.

BACKGROUND ART

A structure of a sample surface can be observed by focusing an electron beam through an electromagnetic field lens, irradiating the sample with the electron beam while scanning the electron beam, and detecting charged particles emitted from the sample (secondary electrons). This configuration is called a scanning electron microscope (SEM). The SEM can only observe the sample surface. On the other hand, a device that focuses an ion beam through an electrostatic lens, and irradiates the sample with the ion beam to finely process an irradiated position is called a focused ion beam (FIB) device. In recent years, a device FIB-SEM in which a FIB is provided together with a SEM has been developed. By using this technique, a sample can be observed while being processed, and information on a three-dimensional structure of the sample can also be obtained. Furthermore, by using this technique, a thin film section sample can be taken out from a desired position of the sample. By observing this thin film sample with a transmission electron microscope (TEM), three-dimensional information of the sample can also be obtained.

However, the technique of obtaining the three-dimensional structure of the sample as described above has a problem. Since a SEM column and a FIB column are provided together in the FIB-SEM, a resolution of the SEM is sacrificed. TEM observation has no problem in terms of resolution, but has a problem that time is required to prepare a thin film sample. In particular, in inspection and measurement of semiconductor devices, whose structure has become three-dimensional in recent years, a time required for evaluation is directly related to a cost.

A gas field ionization source (GFIS) technique can be used to evaluate the three-dimensional structure of the sample in a high resolution and a short time. The GFIS preferably applies a high voltage to a metal emitter tip having a curvature radius of about 100 nm or less at an end, causes an electric field to concentrate at the end, introduces a gas (ionized gas) into the vicinity of the end, ionizes gas molecules, and extracts the ionized gas as an ion beam.

In a GFIS-scanning ion microscope (SIM), as compared to an ion beam emitted from an ion source of a liquid metal or an ion source using a plasma phenomenon, the ion beam emitted from the GFIS has a narrow energy width and a small light source size, and thus the ion beam can be finely focused.

The GFIS is characterized in that ion species to be extracted is changed by changing gas molecules. By extracting hydrogen or helium, which has a small mass, when it is desired to observe the sample surface and extracting ions having a large mass such as neon or argon when it is desired to process the sample surface, damage to the sample at the time of observation can be reduced, and conversely, a processing speed at the time of processing the sample can be increased.

The ion beam emitted from the GFIS is characterized in having a wavelength shorter than that of the electron beam at the same acceleration. Therefore, an aberration due to an influence of diffraction is reduced, and thus a beam aperture angle can be reduced. This means that a focal depth of an observation image (SIM image) is increased. This is a property that works favorably when observing objects at different positions in a depth direction at the same time.

Different from FIB-SEM, the GFIS emits different types of beams from the same beam column when switching between observation and processing. Therefore, the switching can be performed while maintaining an optimal distance between a lens and the sample (working distance), which is an important condition affecting the resolution. Further, the ion beam has a luminance and an energy dispersion equivalent to those of an electron beam extracted from a field emission electron gun. Therefore, the GFIS can obtain the three-dimensional structure of the sample at a higher resolution than that of the FIB-SEM in theory.

Regarding an ion beam device, the following PTL 1 is to "provide an ion beam device capable of performing irradiation while changing ion energy when using an ion beam to perform observation, processing, and measurement, thereby achieving ultra-high-resolution observation, low-damage observation, high-accuracy dimensional measurement, and ultra-fine fast processing according to set conditions," and discloses a technique of "an ion beam device including: a gas field ionization source configured to ionize at least two species of gases; and an electrostatic objective lens including four electrodes, in which the ion beam device includes a control device configured to at least store: a sample voltage and an application voltage on each electrode of the electrostatic lens with respect to a first acceleration voltage in irradiation of a gas ion of a first species; and a sample voltage and an application voltage on each electrode of the electrostatic lens with respect to a second acceleration voltage different from the first acceleration voltage in irradiation of a gas ion of a second species" (refer to Abstract).

Regarding an ion beam device, the following PTL 2 is to "provide, in a technique for observing a cross-section of an electronic component, an ion beam processing and observation technique that can process a sample and observe a processed part of the sample using ion beams extracted from the same ion source," and discloses a technique of "an ion source configured to switch between a gas ion beam species for processing a sample and a gas ion beam species for observing the sample, the ion source including at least two introduction systems each including a gas cylinder 53, 54, a gas pipe, a gas volume adjustment valve 59, 60, and a stop valve 57, 58, in which a gas pressure condition in the vacuum container can be set by the gas volume adjustment valve in each gas system, and by operating the stop valve of the gas system to switch a gas to be introduced into the vacuum container, a pyramid structure of atoms is formed at an emitter tip end" (refer to Abstract).

CITATION LIST

Patent Literature

PTL 1: JP-A-2015-204181
PTL 2: JP-A-2015-167141

SUMMARY OF INVENTION

Technical Problem

In recent years, semiconductor devices have become three-dimensional in order to improve performances thereof. In the first place, control on dimensions is important in manufacture of a semiconductor device, which also applies to the three-dimensional structure. For example, it may be important to know a relative position of two structures located at different depths (overlay). It is generally difficult to know a position of a structural object at an embedded position. By increasing an electron beam acceleration of the SEM, it is possible to improve a penetrative power of the electron beam and observe an internal structure to some extent, but it is difficult to observe a structure in a deep position, or a structure under a structural object that is difficult to transmit an electron beam. In such a case, it is possible to expose the structural object at the embedded position by destructive inspection to measure the position thereof.

By using the FIB-SEM, it is possible to process the sample with an ion beam to expose the structure at the embedded position, and then observe the structure with the SEM. However, in a FIB-SEM in which the FIB is attached obliquely with respect to the SEM, since a processed surface is oblique with respect to the depth direction of the sample, it is difficult to directly measure the overlay.

In a FIB-SEM in which the FIB column is arranged perpendicular to the SEM column, a FIB processed surface is perpendicular to the SEM. Since the processed surface is perpendicular to the depth direction of the sample, it is possible to directly measure a relative position of the structural objects in different depth directions of the sample, that is, the overlay. However, deviation of a position of a stage or the like is deviated due to drift during an exposure time of an upper layer for processing may generate an overlay measurement error. Further, in order to irradiate the sample with an ion beam emitted from the FIB, a sample cross section needs to be formed in advance near a SEM observation position, which causes a problem that time is required to prepare the sample. This also causes a problem that the sample needs to have a small size. For example, it is difficult to introduce a wafer used for manufacturing a semiconductor device into a sample chamber as it is for measurement in this method.

The invention is made in view of the above-mentioned problems, and has an object to provide an ion beam device that can measure structures existing at different positions in a thickness direction of a sample.

Solution to Problem

An ion beam device according to the invention irradiates a sample with an ion beam obtained by ionizing elements contained in a gas. After obtaining a first observation image of a first shape of a first region using a first ion beam, the ion beam device processes a hole in a second region of the sample using a second ion beam, and uses the first ion beam on the processed hole to obtain a second observation image of a second shape of the second region. By comparing the first observation image and the second observation image, a relative positional relation between the first shape and the second shape is obtained.

Advantageous Effect

According to the ion beam device according to the invention, it is possible to uniformly and rapidly process a processing region narrower than an observation view field with low damage. By comparing observation images of a surface shape before and after the processing, it is possible to obtain a relative position in thickness and horizontal directions of a structure at each position among a plurality of structures existing at different positions in the thickness direction of the sample. In this way, it is possible to efficiently and accurately obtain information on a three-dimensional structure of the sample.

BRIEF DESCRIPTION OF DRAWINGS

FIG. 9A is an example in which FIGS. 8B and 8D are displayed in a superposed manner.

DESCRIPTION OF EMBODIMENTS

Figure 1:
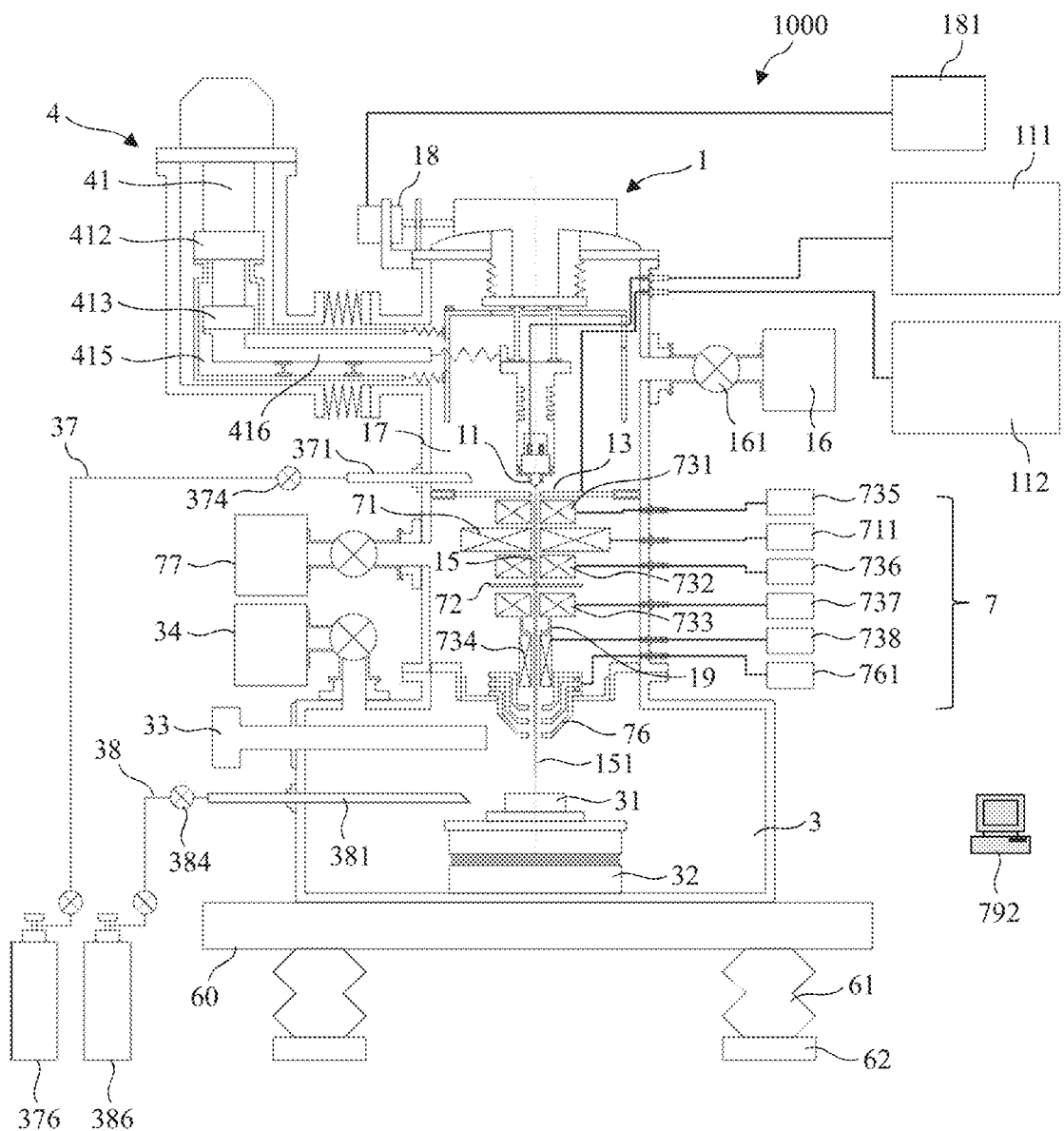
FIG. 1 is a configuration view of an ion beam device 1000 according to a first embodiment.

In the following, in order to facilitate understanding of the invention, first, problems in a current ion beam device will be described. Next, basic principles of the invention will be briefly described. Then, a specific configuration of an ion beam device according to an embodiment of the invention will be described with reference to drawings.

<Problem 1: about Mixed Gas of GFIS>

A FIB-SEM in which a focused ion beam device (FIB) and a scanning electron microscope (SEM) are combined can irradiate a sample with an electron beam, for example, a Ga+ beam from a lateral direction or an oblique direction to process the sample, thereby observing, by the SEM, information on a structure in a depth direction of the sample. On the other hand, due to a restriction of arranging two beam columns, a resolution of the SEM has to be sacrificed. A most advanced semiconductor device has a very fine and three-dimensional structure, and thus it is necessary to both achieve sufficient resolution and obtain information of the three-dimensional structure for inspection and measurement thereof. It is difficult to say that a current FIB-SEM satisfies these requirements. According to observation by a TEM, a very high resolution can be expected, but a large amount of time is required for slicing and thinning of the sample. Time required for the inspection is an important problem directly related to a manufacturing cost in manufacture of a semiconductor device. In order to cope with this problem, a GFIS has been developed.

When an ion beam of the GFIS is to be switched, a gas to be introduced into an ion source is replaced, and an extraction voltage is changed to generate an electric field suitable for ionization energy unique to the replaced gas molecules at an emitter end. In this way, an ion beam corresponding to the replaced gas molecules can be emitted. At this time, time is required corresponding to an exhaust capacity of a pump and an exhaust conductance of the ion source when the gas of the ion source is replaced. As a method for coping with this problem, it is conceivable to mix raw material gases of an ion beam to be used in advance. In this method, a time required to exhaust the gas can be omitted, and thus the ion beam can be switched at a high speed. However, stable ionization of gas molecules of one raw material gas may be inhibited by another raw material gas, which leads to a new problem of an unstable current amount of the ion beam. In particular, when the current amount of the ion beam used at the time of observation becomes unstable, a quality of an image deteriorates, and thus it is desired to stabilize an ion beam current as much as possible.

<Problem 2: About Overlay Observation>

In a FIB-SEM in which the FIB is attached obliquely with respect to the SEM, a processed surface is oblique with respect to the depth direction of the sample. That is, since a processed surface is oblique with respect to the depth direction of the sample, it is difficult to directly measure the overlay. In a FIB-SEM in which the FIB column is arranged perpendicular to the SEM column, a FIB processed surface is perpendicular to the SEM. Since the processed surface is perpendicular to the depth direction of the sample, it is possible to directly measure a relative position of the structural objects in different depth directions of the sample, that is, the overlay. However, deviation of a position of a stage or the like is deviated due to drift during an exposure time of an upper layer for processing may generate an overlay measurement error. Further, in order to irradiate the sample with an ion beam emitted from the FIB, a sample cross section needs to be formed in advance near a SEM observation position, which causes a problem that time is required to prepare the sample. This also causes a problem that the sample needs to have a small size. For example, it is difficult to introduce a wafer used for manufacturing a semiconductor device into a sample chamber as it is for measurement in this method.

<Problem 3: About Acceleration Voltage>

According to an ion beam switching method using the GFIS, a processing ion beam and an observation ion beam are incident in the same direction (usually in a direction perpendicular to the sample surface). In order to sufficiently improve the resolution at the time of observation of the sample surface, it is necessary to improve an ion beam acceleration. However, a high ion beam acceleration at the time of processing not only generates an effect of sputtering and removing atoms on a surface layer, but also causes a mixing effect that positions of atoms on a lower layer are moved by the irradiated heavy ions. This leads to a problem that a structure of interest is destroyed or changed before observation.

In order to cope with this problem, it is conceivable to change an acceleration voltage together when changing a type of the ion beam. That is, high-acceleration light ions are used during the observation of the sample surface, and low-acceleration heavy ions are used during removal of the atoms of the sample surface. The reason is considered as that the low-acceleration heavy ions have a length of penetration into the sample shorter than that in the case where the acceleration is high, and thus can prevent sample destruction in the lower layer. However, in order to change the acceleration voltage of the ion beam, various adjustment of a lens, a polarizer, a mechanical axis, etc. is required, which leads to a new problem that time is required. Therefore, it is generally considered that the acceleration voltage is not a parameter that should be frequently changed.

However, reduction in the acceleration of the ion beam during the processing causes a new problem. In general, the reduction in the acceleration deteriorates a focusing performance of the ion beam, which makes it difficult to process a narrow region. In addition, a change in the acceleration leads to a change in a sputter rate. If the sputter rate is reduced due to the reduction in the acceleration, a throughput of the processing deteriorates.

<Problem 4: About Sputter Rate>

When a processing ion beam having a diameter smaller than that of the structure of interest is used to scan a surface so as to sputter the surface, a problem is present in which due to a local change in the sputter rate or instability of the current amount of the ion beam, the sputtering does not proceed flatly and the structure of interest is destroyed or changed before observation. Furthermore, a non-uniformity of the processing may lead to a defect in measurement by the observation after the processing.

<Problem 5: About Bubbling>

Hydrogen ions emitted from the GFIS include, for example, $H^+$, $H_2^+$, and $H_3^+$. The hydrogen ions are light in mass, and thus are suitable for observing the sample surface. In particular, H3+ has a small energy dispersion width and excellent focusing property, and is suitable for improving the resolution at the time of observation. However, it has been newly found by the study of the inventors that a problem occurs in which a phenomenon called bubbling in which the gas molecules stay inside the sample becomes obvious due to the sample being continuously irradiated with high-acceleration hydrogen ions, and thus the sample surface is pushed up, causing loss of information of an original structure. In order to correctly extract information of the three-dimensional structure from an upper layer to the lower layer, it is necessary to prevent the bubbling phenomenon due to the hydrogen ion irradiation.

<Problem 6: About Processing Depth>

In the present technique, a GFIS in which both an observation beam and a processing beam are irradiated from the same direction is used. In this case, adjustment of a processing depth becomes a problem. In the FIB-SEM, an irradiation height of the ion beam is adjusted by a scanning deflection voltage of the FIB, and thus a position at a thickness direction of the processing can be precisely controlled. In the present technique, both beams are emitted from the same direction, and thus a processing thickness cannot be controlled by such a method.

<About Basic Principle of Invention>

The inventors of the present application have found that the ion beam can be switched without impairing stability of an observation ion beam current by using a combination of a light ion beam (for example, hydrogen ion beam) and a heavy ion beam (for example, neon ion beam) in accordance with the following conditions.

<Basic Principle of Invention: About Problem 1>

Reasons why the ion beam current becomes unstable when the mixed gas is used in the GFIS include presence of an impurity gas. Adsorption of the impurity gas in the vicinity of an emitter end surface of the GFIS greatly disturbs a distribution of the electric field in the vicinity of the emitter end. If the distribution of the electric field is distributed, the ion beam emission is also disturbed accordingly. For example, an impurity is adsorbed in the vicinity of an end surface, and locally enhances the electric field. As the electric field is enhanced, ions start to be released from a portion where the impurity is adsorbed. Meanwhile, due to the adsorption of the impurity, the ion beam current amount from an ion beam extraction position at the emitter end is reduced. This is because an amount of ionized raw material gas molecules supplied to an ionized region is constant.

When a mixed gas of hydrogen gas and neon gas is used, an ionization energy of neon gas is larger than an ionization energy of hydrogen gas, and thus an electric field intensity of the emitter tip end when neon gas is ionized is larger than an electric field intensity when hydrogen gas is ionized. That is, when the ion beam is switched from neon ions to hydrogen ions, the electric field intensity at the emitter tip end is always changed from a larger electric field intensity to a smaller electric field intensity.

The gas molecules that inhibit the stability of the ion beam each have a certain ionization energy as well, and are ionized by an electric field on an emitter tip surface. The ionization energy of neon gas is highest second to an ionization energy of helium gas, and most gas molecules cannot approach an end where neon gas is ionized. Therefore, when the neon ions are released, the end is in a very clean state. Such state is necessarily passed through when the ion source is switched from releasing the neon ions to releasing the hydrogen ions. Therefore, when the hydrogen ions are released, the amount of the impurity gas is small in the vicinity of the end, and the ion current amount is very stable.

Further, the inventors of the present application have found that the use of the hydrogen ions is advantageous per se. Hydrogen gas is a particularly general gas species among gases remaining when a pressure of a vacuum chamber is set to ultra-high vacuum by baking, and may become an impurity when ions other than hydrogen are released from the GFIS. In contrast, when hydrogen gas is introduced and ionized, hydrogen gas is naturally not an impurity, and the stability of the ion beam is higher than that of other ion beams.

An ion beam having a small mass to be used for the observation is required to have high stability, while the ion beam current amount of the ion beam used for processing may not be stable as long as the ion beam can uniformly sputter a surface of interest. That is, by controlling an irradiation amount (dose amount) of the ion beam, a time integration of the ion beam current with respect to each irradiation position can be made uniform, and atoms can be uniformly removed from the surface. Therefore, it is considered that the present problem can be solved as long as a current amount of the hydrogen ion beam for observation can be stabilized.

<Basic Principle of Invention: About Problem 2>

The overlay observation by the FIB-SEM has a problem that when a relative position of an object A located on the upper layer of the sample and an object B located on the lower layer of the sample to be is measured, when the object A is removed by processing, a structural object around the object A is also removed at the same time, and the position of the object A cannot be confirmed again after the object B is exposed.

According to the ion beam switching method using the GFIS, the processing ion beam and the observation ion beam are incident in the same direction. Therefore, it is possible to set an exposure region of the lower layer structure to be narrower than an observation view field. This means that even if the object A is removed, another structure that can confirm the position of the object A again can be observed at the same time as the object B. According to this principle, it is possible to confirm accurate the relative position of the object A and the object B.

Further, when the positions of the object A and the object B in the depth direction are significantly different, a deep focal depth at the time of the observation is required. If the observation ion beam is an observation ion beam by the GFIS, an aperture angle of the beam can be set smaller than that of the electron beam. Therefore, it is possible to obtain an observation image having a deep focal depth.

<Basic Principle of Invention: About Problem 3>

When the acceleration voltage is changed, an optical condition and the like are also changed together, and thus mechanical readjustment is commonly required. However, the inventors of the present application have found that mechanical axis adjustment accompanying the change of the acceleration voltage can be omitted in a special situation in which the information of the three-dimensional structure inside the sample is obtained by repeating sputtering of the atoms on the surface by the low-acceleration heavy ion beam and high-resolution observation by the high-acceleration light ion beam. As a result, it is possible to faithfully extract the information of the three-dimensional structure inside the sample while preventing a surface protrusion caused by the irradiation of the ion beam. Details will be described later.

<Basic Principle of Invention: About Problem 4>

When the surface is irradiated with the neon ion beam, a distribution in a plane of the neon ion beam is changed in accordance with change in a sputter rate of a material existing on the surface using an observation image obtained in advance. The inventors of the present application have found that atoms can be removed while maintaining the surface uniform and smooth in this manner.

<Basic Principle of Invention: About Problem 5>

The inventors of the present application have found that the bubbling phenomenon can be prevented by intermittent irradiation in a certain amount of a low-acceleration neon ion beam after the observation using the hydrogen ion beam. That is, it has been found that the bubbling can be prevented by removing the surface atoms before the gas molecules stay inside the sample. Furthermore, the inventors of the present application have found that the low-acceleration neon ion beam has a short distance of penetration of ions into the sample and a sufficiently high sputter ability for removing the atoms on the sample surface, and an irradiation method that realistically satisfies the above conditions is present. Furthermore, it has been found that a structure of interest of the lower layer can be exposed by the irradiation with the low-acceleration neon ion beam, without being destroyed or largely changed by a mixing phenomenon.

<Basic Principle of Invention: About Problem 6>

The inventors of the present application have found that it is possible to calibrate a depth to which the processing has currently proceeded by obtaining signals of the secondary electrons, the secondary ions, or the like emitted at the time of the irradiation with the low-acceleration neon ion beam and comparing design data of the sample with this signal data.

First Embodiment: Device Configuration

FIG. 1 is a configuration view of an ion beam device 1000 according to a first embodiment of the invention. A gas field ionization source 1 includes an emitter electrode (emitter tip) 11 having a needle-shaped end, an extraction electrode 13, a refrigerator 4, a vacuum chamber 17, a vacuum exhaust unit 16, a gas introduction mechanism 37, and high-voltage power sources 111 and 112.

The extraction electrode 13 has an opening at a position facing the emitter electrode 11. The refrigerator 4 cools the emitter electrode 11. The refrigerator 4 has a refrigerator body 41. The refrigerator body 41 has a first stage 412 and a second stage 413. The vacuum chamber 17 accommodates the emitter electrode 11, the first stage 412, and the second stage 413. The vacuum exhaust unit 16 evacuates the vacuum chamber 17. The gas introduction mechanism 37 supplies hydrogen gas, neon gas, or other gases to the inside of the vacuum chamber 17 individually or simultaneously. The high-voltage power source 111 applies a voltage to the emitter electrode 11, and the high-voltage power source 112 applies a voltage to the extraction electrode 13. By a potential difference therebetween, an electric field for positively ionizing a gas is formed in the vicinity of the end of the emitter electrode 11.

The high-voltage power sources 111 and 112 can be controlled independently, whereby an acceleration voltage of an ion beam and an extraction voltage for forming an ionization electric field can be controlled independently. In order to freely change the acceleration voltage of the ion beam regardless of a magnitude of an ionization energy, it is desirable that the high-voltage power source 112 connected to the extraction electrode 13 is a power source capable of bipolar output, or a power source having a negative polarity with reference to a potential supplied by the high-voltage power source 111. In this way, it is possible to set the acceleration voltage of the ion beam lower than an extraction voltage required for extracting hydrogen ions or neon ions.

The gas introduction mechanism 37 has a gas nozzle 371, a gas flow rate adjustment valve 374, and a gas cylinder 376. The gas is introduced to the gas nozzle 371 and the vacuum chamber 17. The gas flow rate adjustment valve 374 adjusts a gas flow rate. The gas cylinder 376 accommodates a raw material gas.

In order to emit an ion beam 15 from the emitter electrode 11 of the gas field ionization source 1, a high voltage is applied between the emitter electrode 11 and the extraction electrode 13. By the application of the high voltage, an electric field is concentrated on the end of the emitter electrode 11. By setting an intensity of the electric field formed at the end to an intensity sufficient for positive ionization of hydrogen and introducing a gas containing hydrogen gas into the vacuum chamber 17 by using the gas introduction mechanism 37 in this state, a hydrogen ion beam is emitted from the end of the emitter electrode 11. By setting the intensity of the electric field formed at the end to an intensity sufficient for positive ionization of neon and introducing a gas containing neon gas into the vacuum chamber 17 by using the gas introduction mechanism 37 in this state, a neon ion beam is emitted from the end of the emitter electrode 11. It is possible to similarly extract the ion beam by voltage adjustment and gas introduction suitable for gases such as helium, argon, krypton, nitrogen, and oxygen as well.

The inside of the vacuum chamber 17 is maintained at an ultra-high vacuum of $10^{-7}$ Pa or less when no gas is introduced by the gas introduction mechanism 37. In order to reach the ultra-high vacuum inside the vacuum chamber 17, start-up operations of the gas field ionization source 1 may include so-called baking in which the entire vacuum chamber 17 is heated to 100 degrees or higher.

In order to increase a luminance of the ion beam, it is preferable to adjust the cooling temperature of the emitter electrode 11 by the refrigerator 4. The refrigerator 4 cools the inside of the gas field ionization source 1, the emitter electrode 11, and the extraction electrode 13. The refrigerator 4 may be, for example, a mechanical refrigerator of a Gifford-McMahon type (GM type), a pulse tube type, etc., or a refrigerant such as liquid helium, liquid nitrogen, or solid nitrogen. FIG. 1 illustrates a configuration in which a mechanical refrigerator is used. The mechanical refrigerator is constituted by the first stage 412 and the second stage 413 of the refrigerator body 41. Heat from the second stage 413 is transferred to the emitter electrode 11, the extraction electrode 13, and the like by a heat transfer unit 416, so as to cool the same.

The first stage 412 has a cooling temperature lower than that of the second stage. The first stage 412 may be configured to cool a heat radiation shield 415. The heat radiation shield 415 is configured to cover the second stage of the refrigerator, more preferably the emitter electrode 11 and the extraction electrode 13. The heat radiation shield 415 can reduce an influence of heat radiation from the vacuum chamber 17. Therefore, the second stage 413, the emitter electrode 11, and the extraction electrode 13 can be cooled efficiently.

The heat transfer unit 416 can be made of a metal having a high heat conductivity such as copper, silver, or gold. In order to reduce the influence of the heat radiation, surface treatment such as gold plating may be performed such that the surface has a metallic luster. A vibration generated by the refrigerator 4 and transmitted to the emitter electrode 11 may cause an influence such as deterioration of the resolution of a sample observation image due to the ion beam is present, and thus a part of the heat transfer unit 416 may be configured using a flexible component that is unlikely to transmit vibration, such as a metal wire. For the same reason, the heat transfer unit 416 may be configured to transfer heat to the emitter electrode 11 and the extraction electrode 13 by circulating a gas or liquid cooled using the refrigerator 4. When such a configuration is used, the refrigerator 4 may be arranged at a position separated from a body of the ion beam device 1000.

The first stage 412, the second stage 413, and the heat transfer unit 416 may be provided with a unit for adjusting a temperature. By adjusting a temperature of the emitter electrode 11 by the temperature adjustment unit to increase luminances of the respective ion beams, a signal noise ratio at the time of sample observation and a throughput at the time of sample processing are improved.

In order to increase the luminance of the ion beam, a pressure of the gas introduced into the vacuum chamber 17 may be optimized. A total ion current amount emitted from the emitter electrode 11 can be adjusted by a gas pressure value, and emission ratios of respective ions can also be adjusted to some extent by the gas pressure adjustment. The raw material gas is introduced by adjusting the flow rate from the gas cylinder 376 through the gas flow rate adjustment valve 374. A pressure in the vacuum chamber 17 is determined by a balance between a gas exhaust amount by the vacuum exhaust unit 16 and the flow rate of the introduced hydrogen gas. The gas exhaust amount may be adjusted by providing a flow rate adjustment valve 161 between the vacuum exhaust unit 16 and the vacuum chamber 17.

Gases mixed at an appropriate ratio may be used as a gas to be sealed in the gas cylinder 376. For example, in order to allow ions A and ions B to be released from the ion source, a gas obtained by mixing a gas A and a gas B is sealed in the gas cylinder 376. With such a configuration, each of the ions can be released by appropriately adjusting the extraction voltage. However, an impurity gas mixed in the gas field ionization source may cause a problem that the ion beam becomes unstable. That is, a problem is present in which the ion beam becomes unstable due to the gas mixing. In addition, if ionization energies of the mixed gas are close to each other, electric fields required for ionization also have values close to each other, which generates a problem that the ion beam is constituted by a plurality of ions.

When the gas is introduced from the gas introduction mechanism 37 to the entire inside of the vacuum chamber 17 at a high gas pressure, due to heat exchange via the gas introduced between the emitter electrode 11 and the vacuum chamber 17, a problem occurs in which the emitter electrode 11 is not sufficiently cooled and condensation occurs in the vacuum chamber 17. In addition, if a hydrogen gas pressure is high over an entire optical path of the ion beam 15 emitted from the emitter electrode 11, a problem occurs in which a part of the ion beam 15 is scattered and a focusing property of the beam deteriorates. Therefore, the gas pressure introduced into the vacuum chamber 17 is preferably about 0.01 Pa.

When it is necessary to further increase the introduction pressure to be higher than the preferable gas pressure, an inner wall (not shown) surrounding the emitter electrode 11 may be provided inside the vacuum chamber 17. This inner wall surrounds the extraction electrode 13 and maintains an airtightness of a portion of the extraction electrode 13 other than a hole through which the ion beam 15 passes. If the gas is introduced inside of this inner wall from the gas nozzle 371, the gas pressure can be increased only around the emitter electrode 11. With such a configuration, the gas pressure around the emitter electrode 11 can be increased from about 0.1 Pa to about 1 Pa. This upper limit is caused by a discharge phenomenon, and the gas pressure that can be introduced is different depending on a potential difference between the emitter electrode 11 and a component having a ground potential, or a potential difference between the emitter electrode 11 and the extraction electrode 13, a mixing ratio of the gas, and the like. This inner wall may be cooled by the refrigerator 4. This inner wall surrounds the emitter electrode 11, and thus the influence of the heat radiation from the vacuum chamber 17 can be reduced if the inner wall is cooled to the same extent as the emitter electrode 11. If the inside of the inner wall is maintained in an ultra-high vacuum state, the entire vacuum chamber 17 does not necessarily have to be maintained in an ultra-high vacuum state.

The ion beam 15 emitted from the emitter electrode 11 has very high directivity, and thus a position and an angle of the emitter electrode 11 may be adjusted by an emitter electrode drive mechanism 18 so as to be advantageous for focusing a probe current 151. The emitter electrode drive mechanism 18 may be configured to be manually adjustable by a user or automatically adjustable by an emitter electrode drive mechanism controller 181.

The ion beam device 1000 includes the gas field ionization source 1, a beam irradiation column 7, and a sample chamber 3. The ion beam 15 emitted from the gas field ionization source 1 passes through the beam irradiation column 7 and is emitted to a sample 31 arranged on a sample stage 32 inside the sample chamber 3. Secondary particles emitted from the sample 31 are detected by a secondary particle detector 33.

The beam irradiation column 7 includes a focusing lens 71, an aperture 72, a first deflector 731, a second deflector 732, a third deflector 733, a fourth deflector 734, and an objective lens 76. The focusing lens 71, the first deflector 731, the second deflector 732, the third deflector 733, the fourth deflector 734, and the objective lens 76 are supplied with a voltage by a focusing lens power source 711, a first deflector power source 735, a second deflector power source 736, a third deflector power source 737, a fourth deflector power source 738, and an objective lens power source 761, respectively. Each deflector can be constituted by a plurality of electrodes that generate an electric field, such as quadrupole, octupole, and hexadecapole, if necessary. The number of poles of the power source of each deflector needs to be increased in accordance with the number of the electrodes.

The ion beam 15 is focused by the focusing lens 71, has a beam diameter thereof limited by the aperture 72 like the probe current 151, and is further focused by the objective lens 76 to have a fine shape on the sample surface. The first deflector 731, the second deflector 732, the third deflector 733, and the fourth deflector 734 are used for axis adjustment that reduces an aberration during focusing by the lenses, ion beam scanning on the sample, and the like.

The beam irradiation column 7 is evacuated using a vacuum pump 77. The sample chamber 3 is evacuated using a vacuum pump 34. A differential exhausting structure may be provided between the gas field ionization source 1 and the beam irradiation column 7, and the beam irradiation column 7 and the sample chamber 3, if necessary. That is, the spaces may be maintained airtight except for an opening through which the ion beam 15 passes. With this configuration, an amount of the gas introduced into the sample chamber 3 flowing into the gas field ionization source 1 is reduced, and the influence thereof is reduced. Further, an amount of the gas introduced into the gas field ionization source 1 flowing into the sample chamber 3 is reduced, and the influence thereof is reduced.

The vacuum pump 34 may be, for example, a turbo molecular pump, an ion sputtering pump, a non-evaporable getter pump, a sublimation pump, a cryo pump, or the like. The vacuum pump 34 is not necessarily required to be a single pump, and may be a combination of a plurality of the above pumps. In addition, the device may be configured such that the vacuum pump 34 operates in conjunction with a gas introduction mechanism 38 described later, so as to operate only when the gas is introduced from a gas nozzle 381, or a valve may be provided between the vacuum pump 34 and the sample chamber 3 to adjust an exhaust amount.

The ion beam device 1000 may be configured to be arranged on, for example, a device platform 60 constituted by a vibration isolation mechanism 61 and a base plate 62 so that the emitter electrode 11 of the gas field ionization source 1 and the sample 31 arranged inside the sample chamber 3 do not vibrate and deteriorate performances of the sample observation and the sample processing. The vibration isolation mechanism 61 may be configured with, for example, an air spring, a metal spring, a gel-like material, a rubber, or the like. Although not shown, a device cover may be provided to entirely or partially cover the ion beam device 1000. The device cover is preferably made of a material that can block or damp air vibration from the outside.

The sample chamber 3 may be provided with a sample exchange chamber (not shown). By enabling the sample exchange chamber to perform preliminary exhaust for exchanging the sample 31, it is possible to reduce a degree of deterioration of a degree of vacuum of the sample chamber 3 at the time of the sample exchange.

The high-voltage power source 111, the high-voltage power source 112, the focusing lens power source 711, the objective lens power source 762, the first deflector power source 735, the second deflector power source 736, the third deflector power source 737, and the fourth deflector power source 738 may be configured to be able to automatically change an output voltage and a cycle of the output voltage by a calculation device 792, and to adjust a scanning range, a scanning speed, a scanning position, and the like of the ion beam 15. Further, the calculation device 792 may be configured to automatically change the emitter electrode drive mechanism controller 181. The calculation device 792 may store a control condition value in advance, so that the control condition value can be immediately called and used for setting when necessary.

The sample chamber 3 may be provided with the gas introduction mechanism 38 in order to introduce a reactive gas in the vicinity of the sample 31 or to introduce a gas preventing the surface of the sample 31 from being discharged. The gas introduction mechanism 38 includes the gas nozzle 381, a flow rate adjustment valve 384, and a gas cylinder 386. As the reactive gas, for example, XeF2 gas, H2O has, or a halogen-based gas may be used as a gas for promoting etching of the sample 31. As a gas for promoting deposition, TEOS, a hydrocarbon-based gas, or a gas containing a metal such as a WF6 may be used.

When the sample is processed using the gas for promoting the etching, a processing amount of a sample material with respect to an irradiation amount of the ion beam is changed. Depending on the gas species, the processing amount of a specific sample material may be greatly changed alone. For example, in a case where a structure of interest is inside the sample and made of a material that is difficult to etch, the structure can be exposed rapidly and with little change by ion beam irradiation using an etching gas in combination. In a case in which a portion on the surface or inside the sample that is desired to be prevented from the ion beam irradiation, the deposition is effective. For example, if a film is formed on the sample surface by depositing tungsten, it is difficult for the ion beam to reach a portion of the sample under the film. In a case in which a part of the sample has a void, a sputter rate around the void increases, and uniform sputtering may be difficult. In such a case, by filling the void with the deposition and then sputtering the void with a low-acceleration heavy ion beam, the sputter rate becomes spatially uniform, and thus an observation result faithfully reflects an original structure. In this way, a procedure of repeating the processing and the observation may include the etching or the deposition using gases.

First Embodiment: About Stabilization of Mixed Gas and Ion Current

The inventors of the present application have found that the stability of the hydrogen ion beam used for the observation is improved by using a combination of hydrogen gas and neon gas when the processing by sputtering and the observation are repeated by switching the emitted ion beam a plurality of times. Specifically, it has been found that a hydrogen ion beam is specifically stabilized by generating an electric field sufficiently larger than that for ionizing hydrogen at the end of the emitter electrode 11 and then returning to an electric field suitable for ionizing hydrogen. A specific example thereof will be described below.

Figure 2:
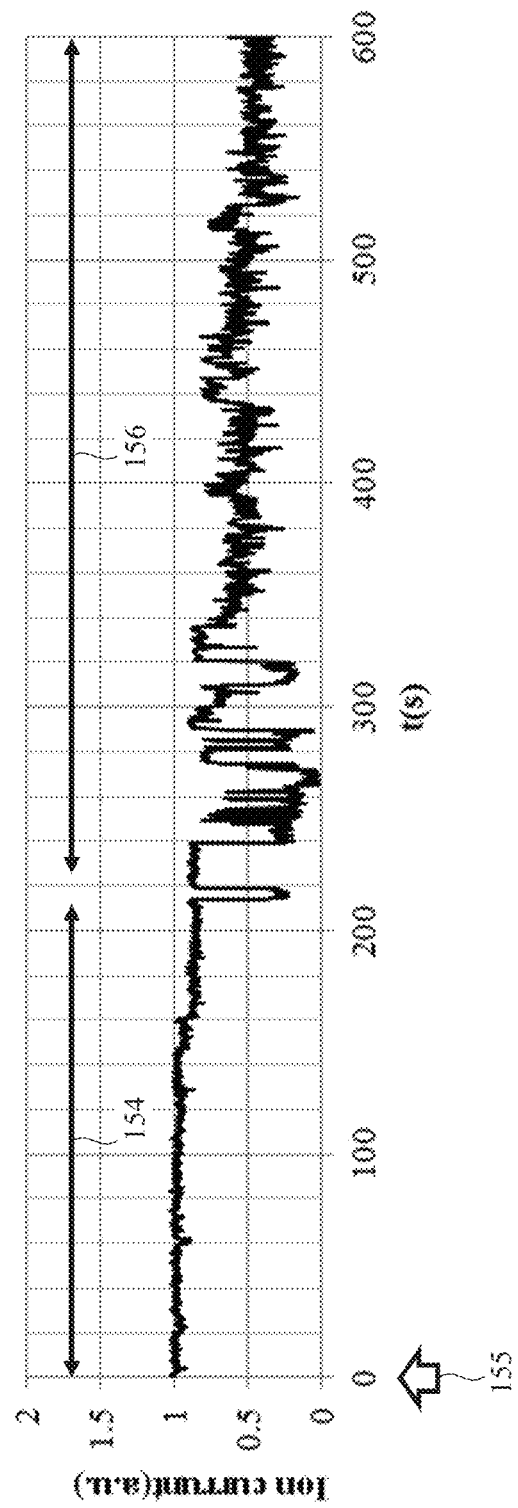
FIG. 2 is a graph illustrating a time change of a current amount of a hydrogen ion beam emitted from a gas field ionization source 1.

FIG. 2 is a graph illustrating a time change of the current amount of the hydrogen ion beam emitted from the gas field ionization source 1. A hydrogen ion beam stabilization interval 154 is present after an electric field recovery time 155. Subsequently, the current amount of the hydrogen ion beam becomes relatively unstable at a hydrogen ion beam unstable interval 156.

Furthermore, the inventors of the present application have also found that an electric field at the end of the emitter electrode 11 required for ionizing neon is sufficient as an electric field for stabilizing the hydrogen ion beam. Therefore, by alternately changing the electric field at the end of the emitter electrode 11 so as to alternately switch between the neon ion beam and the hydrogen ion beam, it is possible to intermittently extract a hydrogen ion beam excellent in stability and suitable for the observation of the sample.

The stability of the observation beam is directly related to a quality of an observation image, and thus is particularly important. The stability of the processing beam is not as important as the stability of the observation beam at the time of a processing that is relatively simple, such as removal of an atomic layer on the surface. The reason is that the processing amount is almost determined by a total current amount per surface of the irradiated ion beam. Therefore, even if the ion current of the neon beam is unstable in time, a desired processing amount can be stably provided by controlling the total irradiated current amount. For the control of an irradiation current amount, the inside of the beam irradiation column 7 may be provided with a Faraday cup 19 for measuring the ion current. In addition, the sample stage 32 may be provided with an electric wire and a current meter for measuring the ion current.

An ionization energy of hydrogen and an ionization energy of neon are sufficiently separated from each other to the extent that ion beams are not mixed, and have no risk of ion beam mixing. Therefore, it is possible to use the hydrogen ion beam and the neon ion beam independently.

First Embodiment: About Bubbling

Figure 3A:
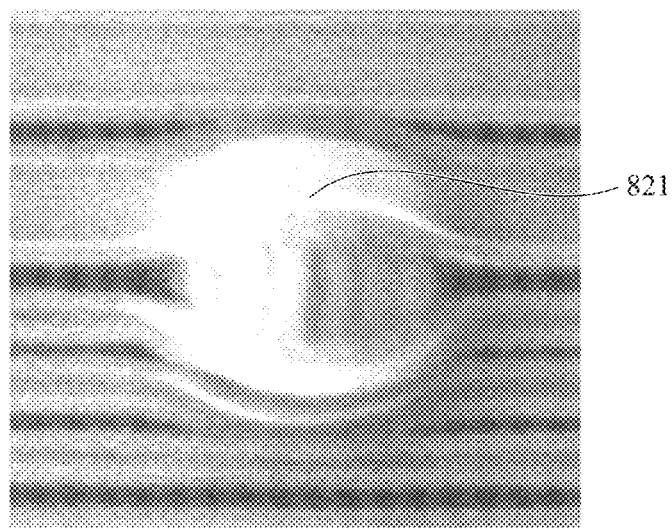
FIG. 3A illustrates an example of a scanning ion image in which a surface is raised due to irradiation with the hydrogen ion beam at an acceleration voltage of 30 kV.

FIG. 3A illustrates an example of a scanning ion image in which a surface is raised due to irradiation with the hydrogen ion beam at an acceleration voltage of 30 kV. The inventors of the present application have found that when the sample 31 is irradiated with the hydrogen ion beam, the sample surface raises and generates a surface protrusion 821. Such a phenomenon varies depending on a type of the sample 31 but does not occur immediately after the irradiation, and the protrusion of the sample starts when a certain threshold value is exceeded.

Figure 3B:
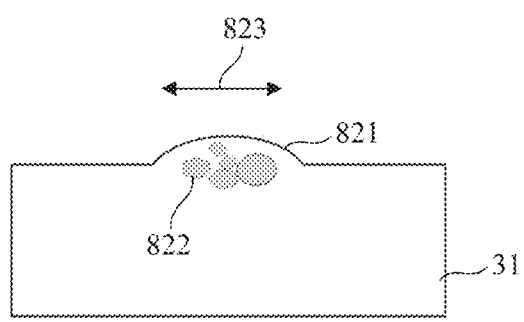
FIG. 3B is a cross-sectional schematic view of FIG. 3A.

FIG. 3B is a cross-sectional schematic view of FIG. 3A. When an irradiation range 823 is irradiated with the hydrogen ion beam, hydrogen gas staying inside the sample is aggregated to form a gas aggregate 822, which pushes away surrounding atoms to form a shape like a bubble. In this way, the surface protrusion 821 is generated. That is, the inventors of the present application have found a problem that when the structure of the sample is deformed by the surface protrusion 821 due to the gas aggregate 822, information of the structure inside the sample, which is originally desired, is lost.

The surface protrusion can be prevented if the lower layer is exposed by removing the atoms on the surface before the gas accumulated in the lower layer of the sample by the observation with the hydrogen ions exceeds an allowable amount for raising the surface. After irradiating with the hydrogen ion beam, a gas having a large mass such as neon gas or argon gas is introduced in place of hydrogen gas to switch to an ion beam having a large mass, and the sample is irradiated with the ion beam having a large mass, whereby the atoms on the sample surface can be removed. A depth of the ions penetrating the inside of the sample when the sample is irradiated with the ions varies depending on a type of the ions and the like. In general, ions having a large mass are less likely to enter the inside of the sample, and tend to prevent occurrence of a phenomenon like the surface protrusion 821.

In order to confirm the above two effects, an attempt was made to remove an atomic layer on the surface by irradiating with the neon ions and argon ions at the acceleration voltage of 30 kV. When the neon ions are used, a protrusion on the surface is observed as in the case of the hydrogen ions. The case in which the argon ions are used will be described below.

Figure 4A:
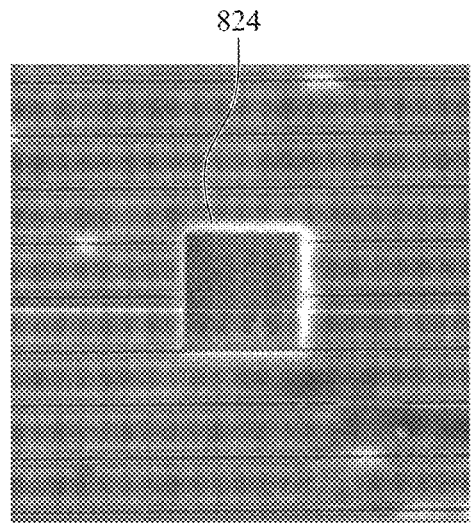
FIG. 4A is a scanning ion image at the time of irradiation with argon ions.

FIG. 4A is a scanning ion image at the time of irradiation with the argon ions. In the case of irradiating with the argon ions, the surface protrusion illustrated in FIG. 3A does not occur, and the atoms on the surface can be removed by sputtering to form a rectangular dent as an argon ion irradiation range 824.

Figure 4B:
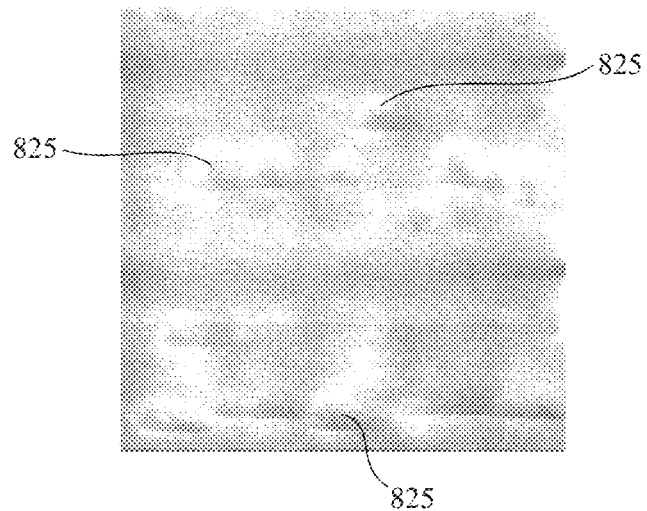
FIG. 4B is an enlarged surface image at the time of the irradiation with the argon ions.

FIG. 4B is an enlarged surface image at the time of the irradiation with the argon ions. In a process of the irradiation with the argon ions, as illustrated in FIG. 4B, a large amount of small surface protrusions 825 are generated at portions irradiated with argon.

Figure 4C:
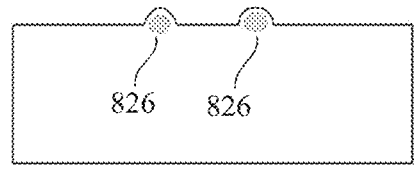
FIG. 4C is a cross-sectional schematic view of FIG. 4B.

FIG. 4C is a cross-sectional schematic view of FIG. 4B. It can be expected that smaller gas aggregates 826 are generated in the lower layer of the sample than in the case of the irradiation with hydrogen. Further, at a high acceleration voltage of 30 kV, when the ions are switched to heavy types, the structure inside of the sample may be destroyed due to an effect of mixing before being observed.

First Embodiment: About Acceleration Voltage and Sputter Rate

A depth of the ions penetrating the inside of the sample when the sample is irradiated with the ions also depends on an acceleration energy of the ions. The penetration depth becomes shallow by reducing the acceleration, and thus the occurrence of a phenomenon such as the surface protrusion 821 tends to be prevented. However, an observation ion beam requires a resolution of at most 1 nm or less and a diameter of the ion beam corresponding to the resolution, and thus requires an acceleration of at least about 30 kV. Therefore, it is necessary to change only a processing ion beam to a low acceleration. However, change of the acceleration voltage of the ion beam involves a large change of the optical condition, and thus it is usually not conceivable to change the acceleration voltage simultaneously with switching of the ion beam type within a short time (for example, within several seconds or within several minutes).

The change in the optical condition due to the change in the acceleration voltage includes various factors such as a difference in deflection sensitivity by the deflector. In order to realize an optimum condition in which the diameter of the ion beam becomes minimum in each acceleration condition, it is necessary to mechanically adjust the position and the angle of the emitter electrode 11. This is because an assembly accuracy of optical elements such as an electromagnetic field lens and a polarizer cannot be set to an ideal state in principle, and axes of respective optical elements are always mechanically deviated in reality. The change of the optical condition accompanied by the mechanical adjustment usually takes a lot of time and effort.

However, the inventors of the present application have found that the mechanical axis adjustment by the emitter electrode drive mechanism 18 accompanying the change of the acceleration voltage can be omitted in a special situation in which information of a three-dimensional structure inside the sample is obtained by repeating sputtering of atoms on the surface by the low-acceleration heavy ion beam and high-resolution observation by a high-acceleration light ion beam. That is, in principle, an axis adjustment and an optical condition optimized for the observation ion beam should be used when irradiating with the observation ion beam and an axis adjustment and an optical condition optimized for the processing ion beam should be used when irradiating with the processing ion beam, but in the first embodiment, the two ion beams are set with a common axis adjustment. Specifically, for the following reason, it is considered that the angle or the like of the emitter electrode 11 does not need to be finely adjusted by using the emitter electrode drive mechanism 18 for the processing ion beam.

In the ion beam device 1000 according to the first embodiment, a diameter of the processing ion beam is larger than a diameter of the observation ion beam. Therefore, it can be said that an irradiation position of the processing ion beam may be lower in accuracy than an irradiation position of the observation ion beam. In addition, with respect to the processing ion beam, as long as a time integration of the ion beam current is uniform for each irradiation position, it is possible to process an irradiation surface to be flat, and thus it is not necessary to strictly control individual irradiation positions. For the reasons described above, at the time of the irradiation with the processing ion beam, the same angle or the like of the emitter electrode 11 as that at the time of the irradiation with the observation ion beam is used, and an optimum condition is used for each ion beam for the optical condition.

To observe the surface, after a lightweight and high-acceleration beam suitable for observation is extracted from the emitter electrode 11, a mechanical axis adjustment is strictly performed by the emitter electrode drive mechanism 18 to optimize the diameter of the ion beam, and moreover, a user may adjust respective optimum conditions of the first deflector 731, the second deflector 732, the third deflector 733, the fourth deflector 734, the focusing lens 71, and the objective lens 76. These optimum conditions are referred to as conditions A. The conditions A may be individually stored in the emitter electrode drive mechanism controller 181, the first deflector power source 735, the second deflector power source 736, the third deflector power source 737, the fourth deflector power source 738, the focusing lens power source 711, the objective lens power source 761, and the like in advance or collectively stored in the calculation device 792, such that the conditions are called at a desired timing.

The first deflector 731, the second deflector 732, the third deflector 733, the fourth deflector 734, the focusing lens 71, and the objective lens 76 may all be of a type that uses an electric field instead of a magnetic field such that original optical conditions are highly reproduced at the time of calling the conditions. An electrostatic lens or an electrostatic deflector has no hysteresis, and can improve a reproducibility at the time of changing the conditions.

After observing a desired position under the conditions of an ion beam suitable for the observation, the low-acceleration heavy ion beam is emitted from the emitter electrode 11 to irradiate the sample 31 with the heavy ion beam, thereby sputtering the atomic layer on the surface in order to observe the lower layer. Target setting voltages are output from the high-voltage power source 111 and the high-voltage power source 112 while adjusting the voltages applied to the emitter electrode 11 and the extraction electrode 13 to such an extent that while the acceleration voltage and the extraction voltage are changed, a positive electric field is always generated, or no electrons are emitted from the emitter electrode 11 even if a negative electric field is generated, in the emitter electrode 11.

When the ion beam type is switched, a direction of the ion beam changes according to the optical condition. In the first embodiment, since the position and the angle of the emitter electrode 11 at the time of each ion beam irradiation are used in common, it is necessary to deflect the processing ion beam again toward the irradiation position. The focusing lens 71 and the aperture 72 are arranged on a path of the processing ion beam, but when a direction of the processing ion beam is changed by switching the ion beam type and the processing ion beam cannot pass through the focusing lens 71 and the aperture 72, the ion beam device 1000 does not operate normally. In this case, it is necessary to enable deflection of the processing ion beam before the processing ion beam reaches the focusing lens 71 and the aperture 72. Specifically, it is desirable to arrange the deflectors closer to the emitter electrode 11 than the focusing lens 71 and the aperture 72 like the first deflector 731 and the second deflector 732. At this time, a condition of the focusing lens 71 may be largely changed from the condition A in a manner emphasizing the current amount emitted to the sample rather than the resolution. When the condition is changed only by an electrostatic effect in such a manner, reproduction of the condition is rapidly performed, and a deviation, a distortion, and the like of the image as described above are reduced.

Since the first deflector 731 and the second deflector 732 prevent the processing ion beam from being deviated from the focusing lens 71 and the aperture 72 accompanying with changing the ion beam type, deflection amounts of these deflectors may be smaller than deflection amounts of the third deflector 733 and the fourth deflector 734, which mainly deflect the observation ion beam. Specifically, lengths (thickness) of the first deflector 731 and the second deflector 732 along an optical axis of the ion beam may be shorter than those of the third deflector 733 and the fourth deflector 734.

First Embodiment: Example of Processing

Figure 5A:
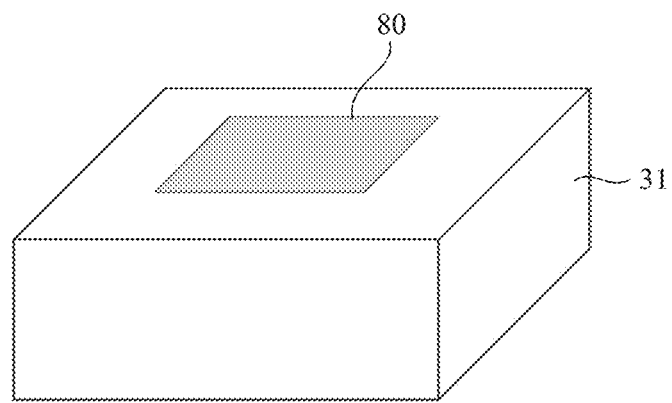
FIG. 5A is a view illustrating a state in which a heavy ion irradiation range 80 of a sample 31 is irradiated with a low-acceleration heavy ion beam.

FIG. 5A is a view illustrating a state in which a heavy ion irradiation range 80 of the sample 31 is irradiated with the low-acceleration heavy ion beam. The irradiation may be performed by scanning an entire surface of the heavy ion irradiation range 80 with an ion beam focused smaller than the heavy ion irradiation range 80. The scanning is, for example, raster scanning or vector scanning. An operation procedure of the vector scanning may be determined by calling a scanning method stored in the device, or by using a user-defined scanning procedure. A user-defined scanning method may be stored in the calculation device 792 so as to be called later to perform similar scanning.

Figure 5B:
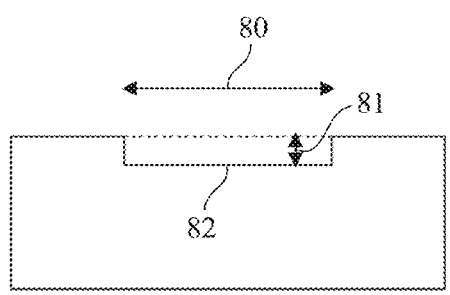
FIG. 5B is a cross-sectional view of FIG. 5A.

FIG. 5B is a cross-sectional view of FIG. 5A. As shown in FIG. 5B, a surface atomic layer at a position of the heavy ion irradiation range 80 is scraped by a sputter depth 81, and a new lower layer surface A 82 appears. This lower layer surface A 82 is observed again under the optimum conditions A under which a high resolution can be obtained by the high-acceleration light ion beam. That is, the conditions A for optimization of the observation ion beam can be reused repeatedly every time the observation is performed.

FIG. 5B schematically illustrates a state in which the sample is scraped off in a rectangular parallelepiped shape, but actually, an edge of a processing range is not perpendicular to the sample surface but slightly oblique. In other words, the lower layer surface A 82 has a flat portion limited to the vicinity of a center of the heavy ion irradiation range 80. Therefore, a distribution in a plane of the irradiation amount of the low-acceleration heavy ion beam may be adjusted within the heavy ion irradiation range 80 in accordance with a length of the sputter depth 81. More specifically, an irradiation amount in the vicinity of a boundary of the heavy ion irradiation range 80 may be set larger than an irradiation amount in the vicinity of the center of the heavy ion irradiation range 80. A changing ratio of this irradiation amount may be changed in accordance with the length of the sputter depth 81.

Figure 6A:
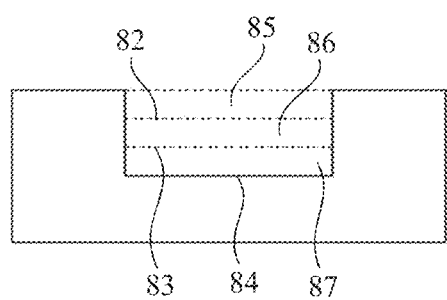
FIG. 6A is a cross-sectional view illustrating a state in which observation and processing are repeated.

FIG. 6A is a cross-sectional view illustrating a state in which the observation and the processing are repeated. The new lower layer surface A 82 exposed as a result of removing a sputter removal layer A 85 by the processing as shown in FIG. 6A is observed. Then, a new lower layer surface B 83 exposed as a result of removing a sputter removal layer B 86 by processing again is observed. Furthermore, a new lower layer surface C 84 exposed as a result of removing a sputter removal layer C 87 by processing again is observed. By observing the lower layers one after another in this way, a three-dimensional structure of the lower layers can be reproduced in a pseudo manner. Here, a diagram corresponding to repetition of three times is illustrated, and more detailed information in the depth direction can be obtained by performing the repetition of three times or more. The irradiation amount of the low-acceleration heavy ion beam may be adjusted such that the sputter depth at the time of processing, that is, a width of each sputter removal layer is always constant.

The hydrogen ion beam has a large acceleration voltage and thus reaches a deeper position in the sample 31. Therefore, in the process of FIG. 6A, when the irradiation with the hydrogen ion beam is repeated, even if an observation position is removed by the processing ion beam, the influence of the hydrogen ion beam is accumulated below the observation area, which may cause bubbling. In order to prevent such bubbling in the lower layer of the sample, thicknesses of the lower layer surface A 82, the lower layer surface B 83, the lower layer surface C 84, and the like may be appropriately adjusted.

Figure 6B:
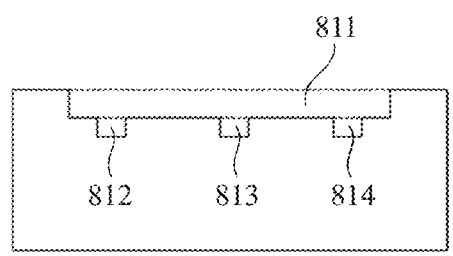
FIG. 6B is an example in which an irradiation region of the low-acceleration heavy ion beam is changed during the repetition of the processing and the observation.

FIG. 6B is an example in which an irradiation region of the low-acceleration heavy ion beam is changed during the repetition of the processing and the observation. For example, after a sputter removal layer D 811 is removed by widening the irradiation region, atomic layers in a range narrower than the sputter removal layer D 811 such as a sputter removal layer E 812, a sputter removal layer F 813, and a sputter removal layer G 814 are removed to observe a lower layer of the sputter removal layer D 811. At this time, depths and intervals of the respective sputter removal layers may be determined with reference to a value input in advance, such as a design value of the sample, which can be known in advance. In the case where the repetition of the same structure in a plane exists inside the sample, by setting the sputter removal layer E 812, the sputter removal layer F 813, and the sputter removal layer G 814 as a length of a repetition cycle of the structure and setting depths of the respective removal layers to be the same, it is possible to perform observation rapidly while comparing repetition portions of the same structure existing inside the sample.

Figure 6C:
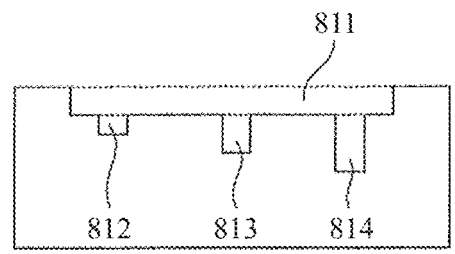
FIG. 6C is an example in which the depths of the respective sputter removal layers are changed.

FIG. 6C is an example in which the depths of the respective sputter removal layers are changed. If the depths of the respective sputter removal layers are changed as shown in FIG. 6C and sputter positions thereof are within a field of view that can be observed simultaneously by light ion irradiation, structures existing at different depths inside the sample can be observed at the same time.

Figure 6D:
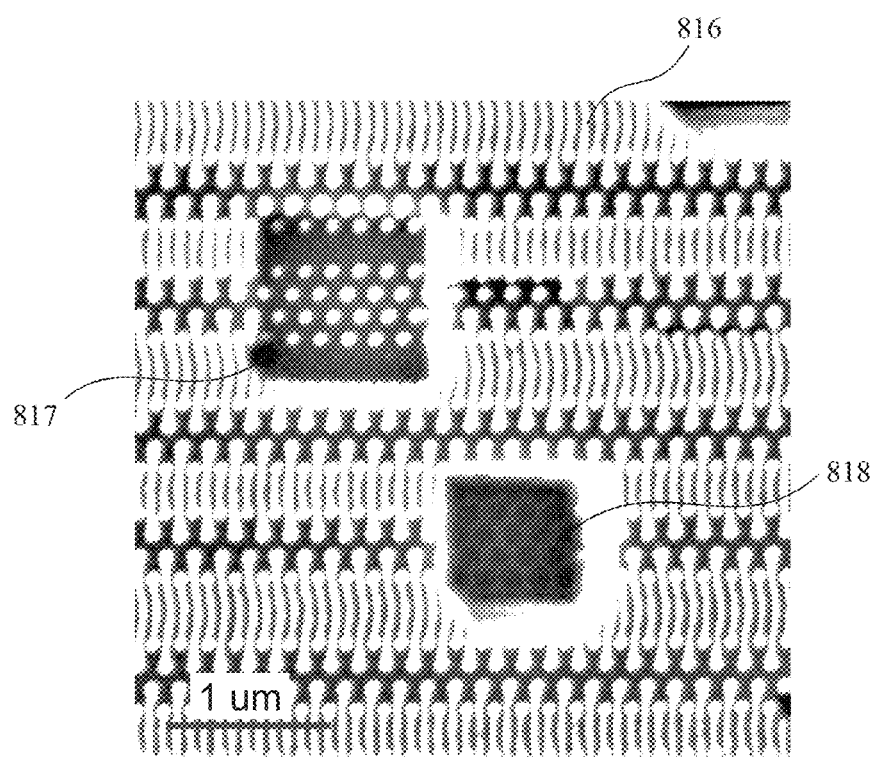
FIG. 6D shows actual observation in the procedure described above of structures of respective layers of a 3D NAND device having a three-dimensional structure.

FIG. 6D shows actual observation in the procedure described above of structures of respective layers of a 3D NAND device having a three-dimensional structure. It can be seen that structure A 816, structure B 817, and structure C 818 existing at respective depths of the 3D NAND device can be observed simultaneously in the same field of view. By such observation, for example, it is possible to evaluate a positional deviation in a direction perpendicular to the depths of the structure A 816, the structure B 817, and the structure C 818 existing at different depths.

In this description, the number of regions to be removed by sputtering is set to three, while this number is not limited and may be larger or smaller. A spatter removal region D 811 may not be provided if unnecessary. In a case where a depth of the spatter removal region D 811 is deep or the region thereof is wide, it is possible to shorten a time by performing preprocessing by another ion beam milling device, mechanical polishing, or the like. In particular, the ion beam milling device may be provided in the sample chamber 3 of the ion beam device 1000 or a sample preparation chamber (not shown) installed together with the sample chamber 3. In such a manner, it is possible to perform the preprocessing at a high speed with an ion beam having a large current while observing by the light ion beam, and it is possible to clearly observe a processing situation of the preprocessing.

Figure 7A:
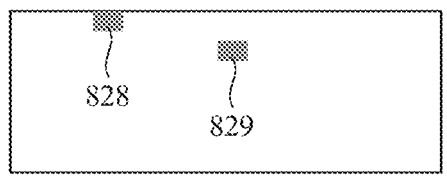
FIG. 7A is an example of a cross-sectional structure of a sample in which at least one structural object whose relative position is to be measured is present inside the sample.

FIG. 7A is an example of a cross-sectional structure of the sample in which at least one structural object whose relative position is to be measured is present inside the sample. In this example, a structural object A 828 is present on the surface and a structural object B 829 is present inside the sample.

Figure 7B:
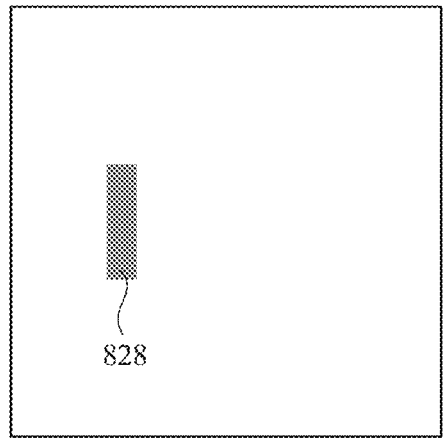
FIG. 7B illustrates an example of a SIM image obtained when an upper surface 815 of a structural object B 829 is observed with a light ion beam before being removed by the low-acceleration heavy ion beam.

FIG. 7B illustrates an example of a SIM image obtained when an upper surface 815 of the structural object B 829 is observed with a light ion beam before being removed by the low-acceleration heavy ion beam. In this example, only the structural object A 828 is observed.

Figure 7C:
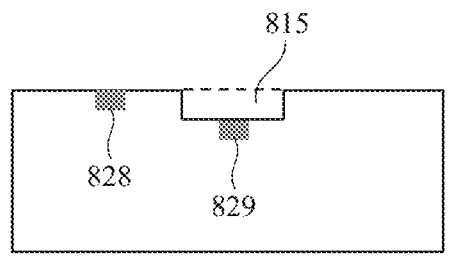
FIG. 7C is a cross-sectional structure example when the upper surface 815 of the structural object B 829 is removed with the low-acceleration heavy ion beam to expose a structural object A 828 and the structural object B 829 on a surface.

FIG. 7C is a cross-sectional structure example when the upper surface 815 of the structural object B 829 is removed with the low-acceleration heavy ion beam to expose the structural object A 828 and the structural object B 829 on the surface.

Figure 7D:
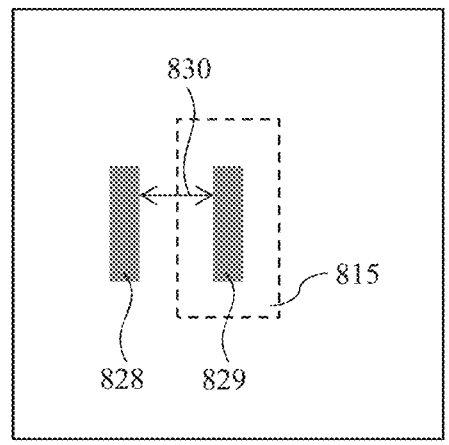
FIG. 7D is an example of a SIM image obtained by observing the upper surface 815 of FIG. 7C.

FIG. 7D is an example of a SIM image obtained by observing the upper surface 815 of FIG. 7C. When a structural object A and a structural object B are observed with the light ion beam so as to enter the field of view at the same time, a relative position 830 of the structural object A and the structural object B can be grasped as shown in FIG. 7D.

Figure 8A:
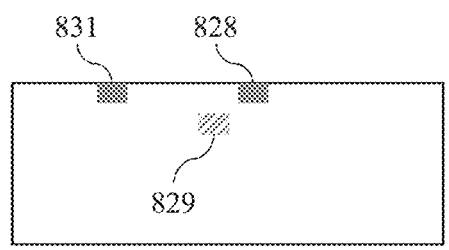
FIG. 8A illustrates a case in which the structural object B 829 is present under the structural object A 828.

FIG. 8A illustrates a case in which the structural object B 829 is present under the structural object A 828. In such case, before the structural object B 829 is exposed on the surface by processing with the low-acceleration heavy ion beam, a relative position of the structural object A 828 and a structural object C 831 which is present in the same layer as the structural object A 828 and not present directly above the structural object B 829 is grasped by the observation with the light ion beam.

Figure 8B:
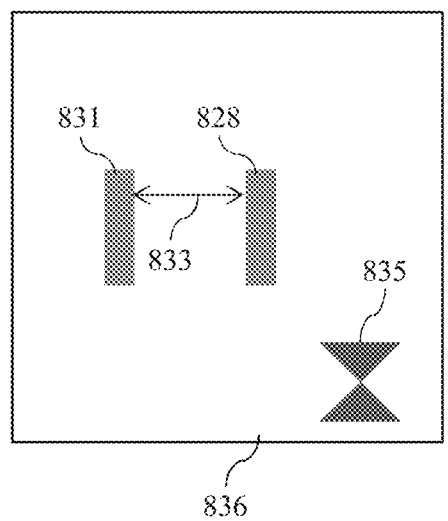
FIG. 8B illustrates an example of a SIM image obtained when the upper surface 815 of the structural object B 829 is observed with the light ion beam before being removed by the low-acceleration heavy ion beam.

FIG. 8B illustrates an example of a SIM image obtained when the upper surface 815 of the structural object B 829 is observed with the light ion beam before being removed by the low-acceleration heavy ion beam. By this observation, a relative position 833 of the structural object C 831 and the structural object A 828 can be grasped.

Figure 8C:
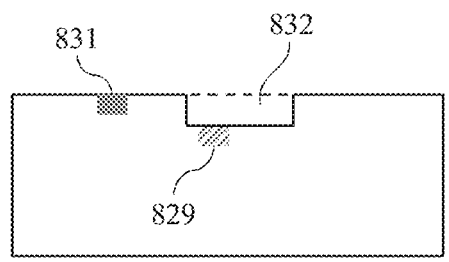
FIG. 8C illustrates a state in which a region 832 including a structural object A is removed by processing with the low-acceleration heavy ion beam to expose the structural object B 829.

FIG. 8C illustrates a state in which a region 832 including the structural object A is removed by processing with the low-acceleration heavy ion beam to expose the structural object B 829.

Figure 8D:
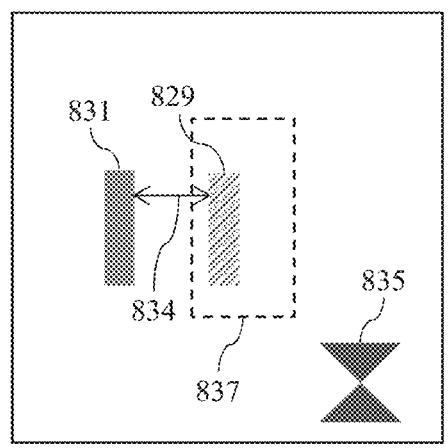
FIG. 8D is an observation image obtained by observing an upper surface of FIG. 8C by the light ion beam.

FIG. 8D is an observation image obtained by observing an upper surface of FIG. 8C by the light ion beam. By this observation, a relative position 834 of the structural object C 831 and the structural object B 829 can be grasped. A desired relative position of the structural object A and the structural object B can be accurately grasped from the relative position 833 and the relative position 834 obtained by the above procedure.

In order to accurately grasp the above relative positions, SIM images before and after the processing may be compared. At this time, coordinates in the SIM images before and after the processing can be made common by performing an arithmetic image processing for matching positions in an unprocessed region of the SIM image after the processing, that is, a region outside the heavy ion beam irradiation region 837 and a region corresponding to the above position in the SIM image before the processing. By such an arithmetic processing, for example, it is possible to correct a deviation of a position due to a drift of the stage of the sample before and after the processing, and to know an original relative position in the sample.

For example, it is possible to match the position by calculating a mean square of differences in luminance values, a mean absolute value of the differences in the luminance values, a normalized cross-correlation function, or the like while raster-scanning the SIM image after the processing with a part 836 of the region of the SIM image before processing as a template. It is desirable that the template includes a characteristic structure 835. When such a structure is not provided, it is also possible to form a pattern by processing with a heavy ion beam in advance for alignment. By preventing the region of the alignment pattern from being irradiated with the heavy ion beam after the pattern is formed, this pattern can be used for alignment of SIM images before and after exposure of the structure of the lower layer. Furthermore, a plurality of the same shapes may be repeated outside the heavy ion irradiation region 837. It is considered that a position drift before and after the processing may be smaller than a repetition of a structural pattern formed in the semiconductor device, and thus the relative position in the sample can still be known if a raster scan region is set to a range narrower than that of the repetition of the structural pattern. The characteristic structure 835 used for alignment does not need to be a single pattern, and a plurality of patterns existing at separated positions can be used.

Such processing is also effective when the processing and the observation have been performed a plurality of times. The template in the SIM image before the processing may be applied to the SIM image after a plurality of times of the processing. This is because that even in the SIM image after a plurality of times of the processing, a shape before the processing is maintained in a region not irradiated with the heavy ions. However, if the observation is also repeated in the same region, the shape may be changed due to the influence of the bubbling and the like. In alignment of a plurality of SIM images, it is not always necessary to use the same region of an unprocessed region. The plurality of SIM images may be aligned by appropriately observing different portions of the unprocessed region.

Figure 9A:
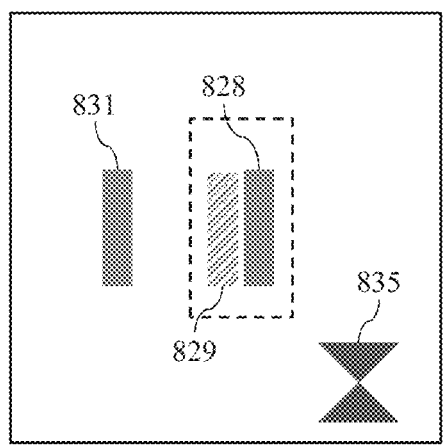

FIG. 9A is an example in which FIGS. 8B and 8D are displayed in a superposed manner. By displaying the above-described SIM images before and after the processing at the same coordinate in a superposed manner after aligning the same, the relative position can be more easily measured. With this display, the relative position of the structural object A 828 and the structural object B 829 can be measured more easily. By changing colors of the images before and after the processing before the display is performed in a superposed manner, the relative position can be measured more easily.

Figure 9B:
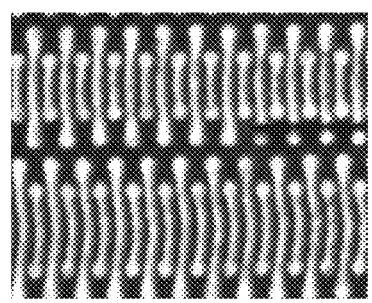
FIG. 9B is an actual result of demonstrating an effect of the above procedure by a 3D NAND which is a sample having a three-dimensional structure.
Figure 9C:
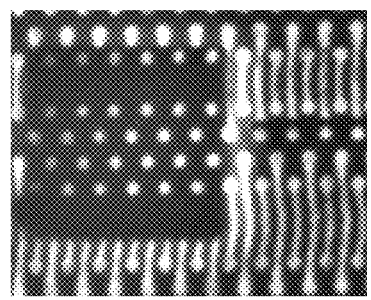
FIG. 9C is an actual result of demonstrating the effect of the above procedure by the 3D NAND which is a sample having a three-dimensional structure.
Figure 9D:
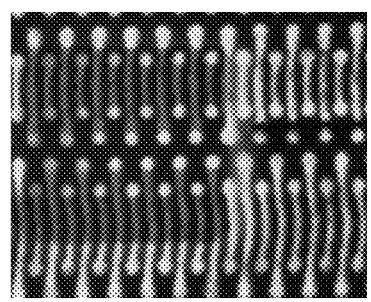
FIG. 9D is an actual result of demonstrating the effect of the above procedure by the 3D NAND which is a sample having a three-dimensional structure.

FIGS. 9B, 9C, and 9D are actual results of demonstrating the effect of the above procedure by the 3D NAND which is a sample having a three-dimensional structure. FIG. 9B is a result of observing the structure on the surface with the light ions before heavy ion irradiation. In contrast, FIG. 9C is a result of irradiating a region of a part illustrated in FIG. 9B with the heavy ions for a certain period of time and exposing a structure of the inside of the region, and then performing the observation again with the light ions. FIG. 9D is an image in which observation images of FIGS. 9B and 9C are superimposed with a portion not irradiated with the heavy ions as a reference for the position. In this way, according to the present procedure, a positional relation between a structure of an upper portion and a structure of a lower portion can be grasped accurately.

The present technique using GFIS, in which the observation beam and the processing beam are emitted from the same direction, has a problem in adjustment of a processing depth. In a FIB-SEM, a position in a thickness direction of the processing can be precisely controlled by adjusting an irradiation height of the ion beam by a scanning deflection voltage of the FIB. In the present technique, both beams are emitted from the same direction, and thus a processing thickness or the processing depth cannot be controlled by such a method.

If the condition is constant, an amount of sputtering of atoms of the sample is proportional to an irradiation amount of ions, and thus depth information can be obtained from an irradiation amount of the heavy ions to be irradiated. The depth may be calculated and displayed on each surface observation image after each processing from the irradiation amount of the heavy ions obtained in advance and a calibration value of a sputter amount of the sample, or may be added to observation image data. The depth may be calculated in the same manner from a known sputter rate, and depth data may be displayed or added to the observation image. By such a function, for example, a thickness of the sputter removal layer A 85, the sputter removal layer B 86, or the sputter removal layer C 87 in FIG. 6A can be obtained. In this way, a relative position in the depth direction of the lower layer surface A 82, the lower layer surface B 83, and the lower layer surface C 84 can be obtained.

However, conditions for sputtering the sample are not constant but often vary. For example, if a material of the structure existing in the plane of the sample is different, the sputter rate is naturally different, and thus the sputter amount, that is, the depth is different with respect to the same ion irradiation amount. In such a case, a distribution in a plane of the irradiation amount of the heavy ions may be adjusted in consideration of such change in the sputter rate. In order to adjust the distribution in the plane of the irradiation amount of the heavy ions, a sample surface observation image obtained before the processing by the light ions is effective. The reason is that an amount of signal electrons emitted from the sample surface by the light ion irradiation basically varies depending on the structure or the material of the surface. By using this property, for example, the distribution in the plane of the irradiation amount of the heavy ions may be determined from a luminance obtained in the observation image before the processing. More specifically, the distribution in the plane may be determined such that the irradiation amount is large where a luminance obtained from the light ion observation image is high, and the irradiation amount is small where the brightness is low, or vice versa.

Structural information of the sample is useful for adjusting the distribution in the plane of the irradiation amount of the heavy ions. For example, on the basis of design of the semiconductor device, with respect to regions having different signal electron amounts in an observation image observed with the light ion beam before processing, a material and a shape of the region are identified on the basis of prior information of the structure of the sample (for example, design information of the semiconductor device). By using this information, the distribution in the plane of a heavy ion irradiation amount of the region to be processed from now on may be determined. By combining a luminance distribution in the plane obtained from the observation image in this manner and a design of the semiconductor device as the sample, it is possible to predict a material used to form a region in the plane and a depth of the region. If the distribution in the plane of the heavy ion irradiation amount is determined on the basis of such information, it is possible to perform processing while keeping the processed surface flat. In particular, by comparing the design and a result of segmentation on the basis of the luminance distribution in the plane obtained from the observation image, the material used to form the region in the plane and the depth of the region can be predicted at high accuracy.

Figure 10:
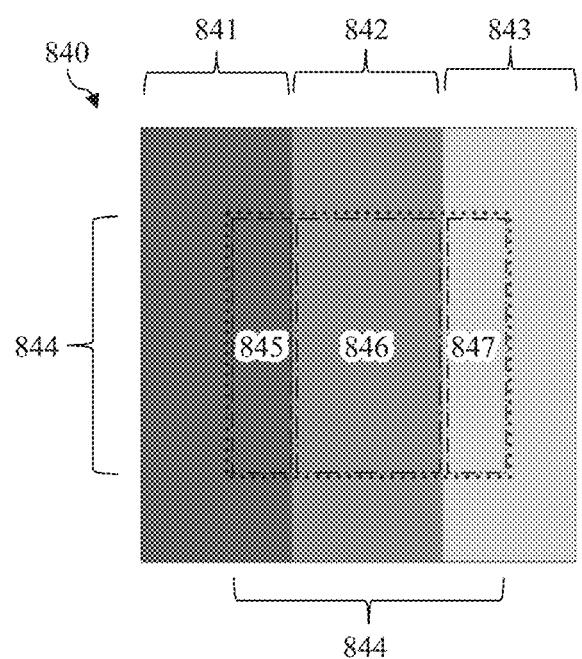
FIG. 10 is an example of a SIM image obtained by light ions.

FIG. 10 is an example of a SIM image obtained by the light ions. A SIM image 840 shown in FIG. 10 includes three regions in which the signal electron amounts are different (region A 841, region B 842, and region C 843). It is assumed that information is obtained in advance that three types of materials exist in the regions from the design of the sample, which are silicon, silicon oxide, copper, or the like from the left. In this case, it can be identified that the region A 841 is made of silicon, the region B 842 is made of silicon oxide, and the region C 843 is made of copper. If, for example, a heavy ion irradiation region 844 is set at a position observed in this manner, an ion irradiation amount calculated back from a sputter rate of silicon, a sputter rate of silicon oxide, and a sputter rate of copper can be set in the irradiation region A 845 (indicated by a dotted line in the drawing), the irradiation region B 846 (indicated by a dotted line in the drawing), and the irradiation region C 847 (indicated by a dotted line in the drawing), respectively, and the entire heavy ion irradiation region 844 can be processed flatly.

In the above-described method for changing the distribution in the plane of the heavy ion irradiation, the observation image formed by the light ion irradiation is taken as an example, but since an observation image may also be obtained by the heavy ion irradiation, such observation image may be used as well. In such a mode, feedback can be applied by the heavy ion irradiation alone without switching to the light ion irradiation for the observation, and thus it is possible to obtain a flat processed surface more rapidly than the above procedure.

On the processed surface after determining the above-mentioned distribution in the plane of the heavy ion irradiation amount and actually irradiating the distribution in the plane with the heavy ions, unevenness of the sample surface after the processing may be measured with an atomic force microscope (AFM) or the like, and a distribution in the plane of the next irradiation amount may be determined based on a measurement result thereof. For example, an irradiation amount of a position having a height higher than those of other positions as a result of the measurement may be increased in the next heavy ion irradiation. Alternatively, by repeating the heavy ion irradiation and the measurement with the AFM, a reduction amount of thicknesses of respective regions due to the heavy ion irradiation may be measured, the sputter rate may be directly measured, and the distribution in the plane of the heavy ion irradiation amounts may be determined based on this value. By such a feedback mechanism, the sample surface after the processing can be processed more flatly.

After considering how to change the procedure of the observation and the processing for evaluating the three-dimensional structure of the sample by using the above method, and the conditions thereof, in particular, the distribution in the plane of the heavy ion beam irradiation amount when repeating the processing and the observation, the conditions may be stored, so that the evaluation can be performed again under the same conditions. As a result, when places having the same structure in the sample are to be evaluated a plurality of times, it is possible to detect a change and an abnormality in shape. If a plurality of such formulae are prepared and can be called in accordance with the structure of the sample, it is possible to perform inspection and measurement of a sample having a variety of three-dimensional structures.

The distribution in the plane of the irradiation amount can be changed by adjusting a residence time of the ion beam at each irradiation position or adjusting the current amount of the ion beam. In order to adjust the irradiation amount, it is necessary to know the current amount of the ion beam to be emitted and a fluctuation thereof. The current amount of the ion beam may be measured by a Faraday cup 19 before, during, or at the end of the irradiation of the sample. The Faraday cup may be arranged at any position. The example of FIG. 1 illustrates that the Faraday cup is arranged at a lower portion of the third deflector 733. By changing the beam using the third deflector 733, it is possible to irradiate the Faraday cup 19 with the ion beam and to measure the amount current by an instrument such as a Pico ammeter (not shown). The fluctuation of the current amount of the ion beam can be measured by a method of frequently switching the current measurement of the Faraday cup 19 and ion beam irradiation to the sample by the deflectors. Alternatively, by measuring an ion beam amount that collides with a diaphragm limiting an irradiation angle of the ion beam, it is possible to indirectly know the fluctuation of a current amount of an ion beam that passes through the diaphragm and is emitted to the sample. The current amount of the ion beam can be adjusted by a partial pressure of the ionized gas introduced into the gas field ionization source, an extraction voltage applied between the emitter tip and the extraction electrode, a cooling temperature of the emitter tip, or the like.

Regarding calibration of the depth, if a known structure is present in the depth direction of the sample, the structure can be used to know to what depth the sample has been dug by the heavy ion irradiation. For example, in a layer in which a memory bit of the 3D NAND structure exists, insulations and conductors are layered in the depth direction, and it is possible to know to what depth the sample has been dug by the heavy ion irradiation in accordance with this layer structure.

Figure 11A:
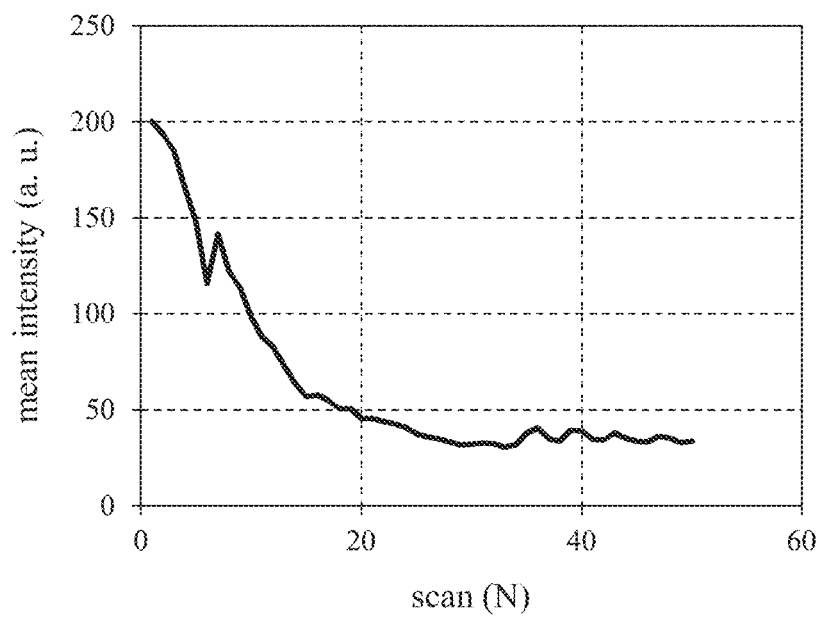
FIG. 11A is a result obtained by plotting an amount of secondary electrons emitted from an irradiation position to the number of times of irradiation when a rectangular region of a 3D NAND sample having the three-dimensional structure is irradiated with heavy ions a plurality of times.

FIG. 11A is a result obtained by plotting an amount of secondary electrons emitted from the irradiation position on the number of times of the irradiation when a rectangular region of a 3D NAND sample having a three-dimensional structure is irradiated with the heavy ions a plurality of times. As the number of times of the irradiation increases, the sputtering proceeds and the processing depth is deeper.

Figure 11B:
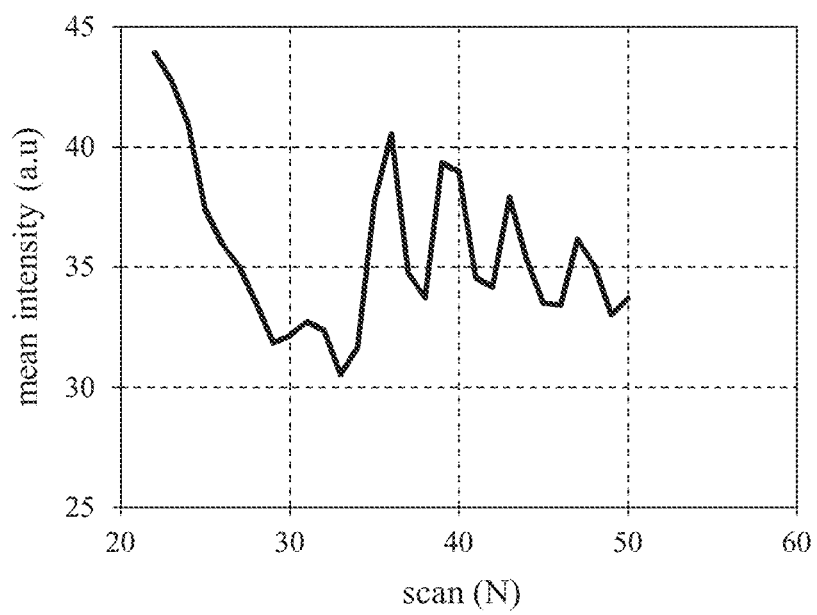
FIG. 11B is an enlarged display of scans from a 20th scan.

FIG. 11B is an enlarged display of scans from a 20th scan. According to this graph, a state is observed in which a signal amount of the secondary electrons is vibrated about four times after the number of times of scan exceeds 35 times. This reflects a layer structure of a memory layer of the 3D NAND (a layer structure of insulation films and conductor films). A first peak corresponds to a first conductor layer, a second peak corresponds to a second conductor layer, a third peak corresponds to a third conductor layer, and a fourth peak corresponds to a fourth conductor layer of the memory layer. In other words, it can be seen that if the processing is terminated exactly at a position of an Nth peak, the depth of the hole is a depth that just reaches an Nth film. This utilizes an essential property that a secondary electron emission amount is larger in a conductor than that in an insulator.

Figure 11C:
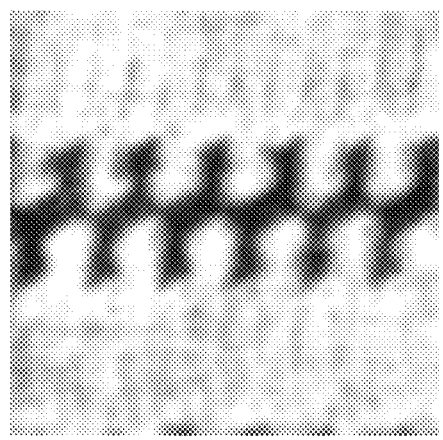
FIG. 11C is an observation image corresponding to a first scan.
Figure 11D:
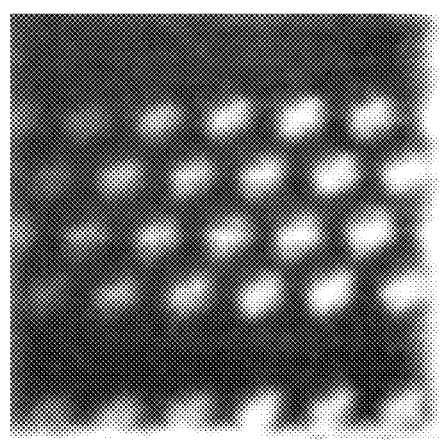
FIG. 11D is an observation image corresponding to a tenth scan.
Figure 11E:
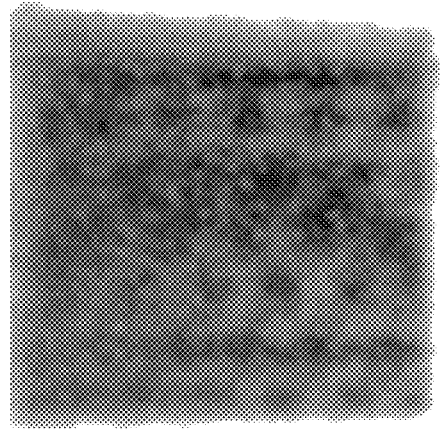
FIG. 11E is an observation image corresponding to a 36th scan.

FIG. 11C is an observation image corresponding to a first scan, FIG. 11D is an observation image corresponding to a tenth scan, and FIG. 11E is an observation image corresponding to a 36th scan. When focusing of the ion beam of the irradiated heavy ions has converged sufficiently smaller than that of the sample structure, it is possible to sputter while directly observing the change in the structure. By directly observing a scanned image of heavy ions, it is possible to detect how deep the hole is at that time.

If a structural object to be measured is buried inside the sample and the periphery of the structural object is not to be destroyed, a dummy structure may be created by a process the same to or similar to the structure is arranged in advance in the vicinity of the structure. Measurement of a relative position between the dummy structure and the structural object in the upper layer may be performed by the above-described method. Accordingly, it is possible to obtain a certain amount of information without destroying the structural object to be measured and the structure in the vicinity thereof. For example, if the dummy structure is arranged to surround the vicinity of an object, a tendency of a positional deviation between the structural body and the structural body in the upper layer can be obtained without destroying the structural object.

The above shows examples in which a secondary electron amount by the heavy ion irradiation or image formation by obtaining secondary electrons are used for the calibration of the depth, but the depth can also be configured with other signals generated with the heavy ion irradiation. For example, the depth can be configured by detecting secondary ions, neutral particles, and the like generated by the heavy ion irradiation. In particular, the secondary ions, the neutral particles, and the like derived from the sample will be useful markers for knowing to what depth the sample has been processed by specifying the type thereof by mass spectrometry. In the mass spectrometry of the secondary ions, an ion mass spectrometry based on flight time, a quadrupole mass spectrometer, and the like can be used. In the mass spectrometry of the neutral particles, the mass spectrometry methods of ions as described above can be used after the neutral particles are once ionized by laser irradiation or the like. According to this method, for example, if an MgO film is formed at a depth of 100 nm of the sample, it is possible to know that the sample has been processed by the heavy ion irradiation to a depth of about 100 nm when Mg ions are detected as secondary ions or neutral particles.

First Embodiment: Overview

The ion beam device 1000 according to the first embodiment repeats an operation mode of observing the sample 31 by irradiating the sample 31 with the light ion beam (for example, the hydrogen ion beam; the same hereinafter in this overview) and an operation mode of removing the surface of the sample 31 by irradiating the sample 31 with the heavy ion beam (for example, the neon ion beam; the same hereinafter in this overview), thereby obtaining the three-dimensional structure of the sample 31. Accordingly, it is possible to prevent the influence of the bubbling generated by the hydrogen ion beam and to accurately obtain the three-dimensional structure of the sample 31.

The ion beam device 1000 according to the first embodiment supplies the mixed gas, in which raw material elements of respective ion beams are mixed, to the vicinity of the emitter electrode 11, and causes the emitter electrode 11 to generate each ion beam by switching an ionization voltage.

Furthermore, the ionization energy of the heavy ion beam is larger than the ionization energy of the light ion beam. The ion beams can be switched in a short time by generating the ion beam using the mixed gas, and in addition, it is also possible to stabilize the light ion beam current during the observation as described in Problem 1.

The ion beam device 1000 according to the first embodiment forms each ion beam such that the diameter of the heavy ion beam is larger than the diameter of the light ion beam. The irradiation amount of the light ion beam current is strictly controlled (the ion current at each time is within a predetermined range). The time integration of the ion current of the heavy ion beam current is set to be uniform at each irradiation position. As a result, the irradiation position and the ion current of the heavy ion beam do not need to be strictly controlled as compared to the light ion beam. Therefore, the surface of the sample 31 can be uniformly processed even if the heavy ion beam current is unstable.

The ion beam device 1000 according to the first embodiment has common positions and angles of the emitter electrode 11 at the time of the light ion beam irradiation and at the time of the heavy ion beam irradiation (the position and the angle are adjusted in advance so as to be optimal at the time of the light ion beam irradiation). As a result, it is not necessary to mechanically perform fine adjustment on the emitter electrode 11 when switching the ion beam type, and thus the throughput can be improved. The deflectors are arranged closer to the emitter electrode 11 than the focusing lens 71 and the aperture 72, and thus it is possible to deflect the heavy ion beam so as to reliably pass through the focusing lens 71 and the aperture 72 upon the ion beam switching.

The ion beam device 1000 according to the first embodiment uses the high-acceleration light ion beam at the time of the observation of the sample and uses the low-acceleration heavy ion beam at the time of the processing of the sample. As a result, it is possible to improve the accuracy of the observation position at the time of the observation of the sample and prevent damage to the lower layer of the sample at the time of the processing.

The ion beam device 1000 according to the first embodiment removes the upper surface 815 and obtains the second observation image of the structural object B 829 inside the sample after obtaining a first observation image of the structural object A 828 (refer to FIGS. 7A to 7C). By comparing the first observation image and the second observation image, it is possible to obtain a relative positional relation between the structural object A 828 and the structural object B 829, which are at different positions in the depth direction.

The ion beam device 1000 according to the first embodiment removes the sputter removal layer E 812, the sputter removal layer F 813, and the sputter removal layer G 814 (atomic layers of a range narrower than the sputter removal layer D 811) and then obtains an observation image of the sputter removal layer D 811, whereby the lower layer inside the sample can be observed from above the sample (refer to FIGS. 6A to 6D).

The ion beam device 1000 according to the first embodiment obtains the first observation image of the structural object A 828 and the third observation image of the structural object C 832 on the sample surface and compares the first observation image and the third observation image, thereby obtaining a first relative positional relation therebetween (refer to FIGS. 8A and 8B). After that, the ion beam device 1000 according to the first embodiment obtains the second observation image after exposing the structural object B 829 by removing the region 832, and compares the first observation image and the second observation image, thereby obtaining a second relative positional relation therebetween (refer to FIGS. 8C to 8D). By comparing the first relative positional relation and the second relative positional relation, a relative positional relation between the structural object A 828/the structural object B 829/the structural object C 831 can be obtained.

Second Embodiment

Figure 12:
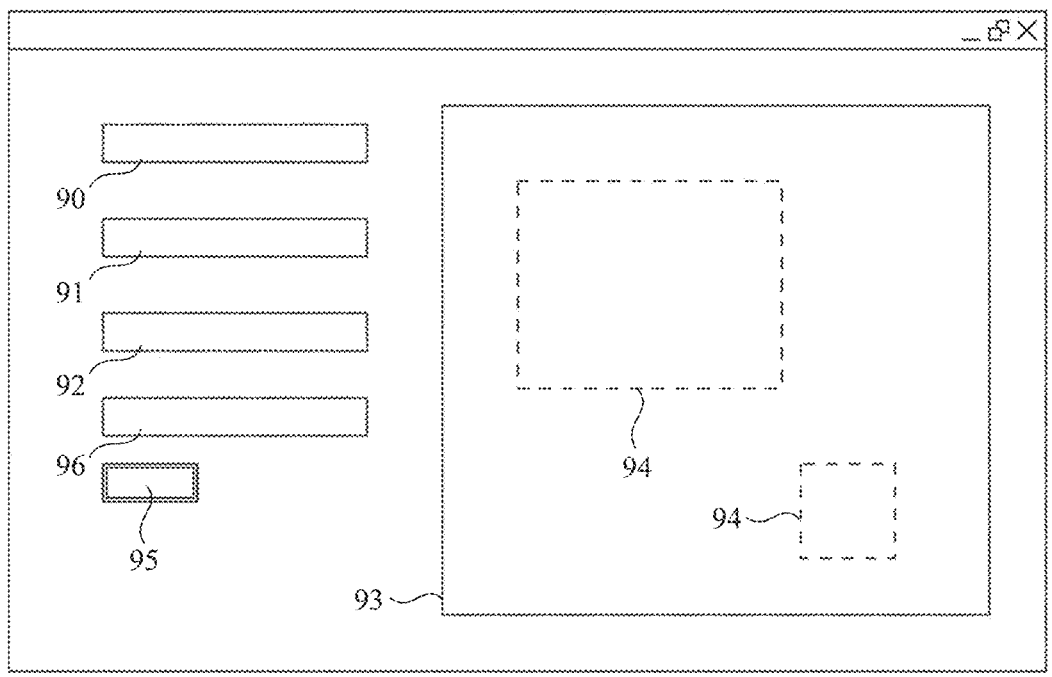
FIG. 12 is an example of a GUI provided by a calculation device 792.

FIG. 12 is an example of a graphical user interface (GUI) provided by the calculation device 792. A number of times of scan setting field 90 is a field for inputting the number of times of scanning an entire surface of the heavy ion irradiation range 80. A scanning speed setting field 91 is a field for inputting a scanning speed. An irradiation amount setting field 92 is a field for inputting an irradiation amount of a low-acceleration heavy ion beam. The irradiation amount of the ion beam is determined depending on how many times the heavy ion irradiation range 80 is scanned by a current amount of the probe current 151. That is, the irradiation range, the current amount of the probe, the number of times of scan, the scanning speed, and the number of times of scan are correlated with each other, and thus, when a user sets any one of these values, the calculation device 792 may automatically calculate the other values and display the values on the GUI.

An observation image display field 93 is a field for displaying a scanning ion image observed by the high-acceleration light ion beam. Based on the observation image displayed in this field, a designation frame 94 for the user to determine, for example, the heavy ion irradiation range 80 may be designated by a pointing device or the like. The designation frame 94 may be displayed on multiple GUIs at the same time. With this function, the user can designate multiple irradiation ranges at the same time, so that different observation surfaces inside the sample can be exposed at the same time, and the observation becomes rapid.

An optical condition of the ion beam at the time of irradiation with the high-acceleration light ion beam is different from an optical condition of the ion beam at the time of irradiation with the low-acceleration heavy ion beam, and thus a position at which the probe current 151 is applied to the sample 31 generally varies depending on the difference in the optical conditions. When the irradiation range is designated by the designation frame 94 on the scanning ion image observed with the high-acceleration light ion beam, it is necessary to perform calibration so that the position is actually irradiated with the low-acceleration heavy ion beam. For example, the calibration can be performed by leaving a processing trace at an appropriate position on the surface of the sample 31 by the low-acceleration heavy ion beam and observing this processing trace by the high-acceleration light ion beam. The GUI may be provided with a calibration button 95 for automatically or semi-automatically starting this procedure.

The procedure of sputtering removal and observation as described above may be displayed on the GUI in an editable manner. In the case where the sputter removal and the observation are repeated under the same condition every time, the GUI may be provided with a setting field 96 for setting the number of times of repetition.

Third Embodiment

The first and second embodiments may be provided with two or more other modes in which the acceleration or the like is changed during repetition of a first mode of performing the observation and a second mode of performing the processing. In particular, at the time of the sputtering removal by the low-acceleration heavy ion beam, by irradiating with the heavy ion beam at a further reduced acceleration before the target surface is exposed, damage to the structure to be observed is reduced, and thus an observation result can more faithfully reflect the sample structure.

For example, when the sample 31 is Si, neon ions having an acceleration voltage of 2 kV penetrate the inside of the sample 31 by about 20 nm. The sample may be damaged by the processing by a depth corresponding to this penetration length, and an original structure may be lost due to a mixing effect. In this case, for example, by preparing a third mode of irradiating with neon ions having an extremely low acceleration (for example, 500 V or less) and performing the sputtering removal to a depth of 20 nm by this third mode, the observation in the first mode can be performed at a state in which damage due to the mixing effect generated inside the sample is reduced.

In other words, when the sample is processed in the second mode, a damaged portion remains on a bottom of a processed surface of the second mode, and thus a finishing processing can be performed by reprocessing the damaged portion in the third mode. This is because the ion penetration depth in the third mode is smaller than that of the second mode. An accurate observation result can be obtained by observation in the first mode after the finishing processing.

The finishing processing by the third mode may be performed on the processing region (or a vicinity region of the processing region) every time the second mode is performed, or may be performed before observation by the first mode, or may be performed at both the timings. For example, in FIG. 6C, the third mode may be performed when each one of the sputter removal layer E 812, the sputter removal layer F 813, and the sputter removal layer G 814 is processed, or may be performed before observing the three holes.

Such processing mode for reducing the damage to the sample due to the mixing effect includes, for example, a method of irradiating with ions having a larger mass number, in addition to reducing the acceleration voltage of the heavy ions as described above. For example, after the irradiation with the neon ions of 2 kV, by performing irradiation with ions of 2 kV having a larger mass than that of the neon ions such as argon ions, krypton ions, or the like, a thickness of a damage layer due to the irradiation with the neon ions of 2 kV can be reduced. This is because the ions having a larger mass have a shorter depth of penetration into the above sample.

Further, the thickness of the damage layer due to the neon ions of 2 kV can be reduced by combining these two methods, i.e., irradiating with ions of 500 V having a larger mass than that of the neon ions such as the argon ions, the krypton ions, or the like after irradiating with the neon ions of 2 kV.

The damage can be reduced by changing an application voltage on the sample in addition to the acceleration voltage of the beam. For example, a voltage of 1.5 kV applied to the sample with respect to the irradiation of the neon ions of an acceleration of 2 kV results in an irradiation energy of the ions of 500 V. That is, a voltage applied to the sample in the third mode may be larger than a voltage applied to the sample in the second mode.

The finish processing by the third mode of the invention is characterized in being capable of being performed at a necessary portion alone in a very local manner as compared to other types of finishing processing by ion irradiation. By setting a processed surface of the hole processing by the second mode and a processed surface of the finishing processing by the third mode in the same region, it is possible to reduce the thickness of the damage layer alone on the processed surface of the second mode alone while preventing the region not processed in the second mode from being damaged by the finishing processing ion irradiation in the third mode. In this way, for example, as shown in the first embodiment, when a relative position of an upper layer and a lower layer is measured by comparing or superimposing the images before and after the processing using the surface not processed in the second mode as a position reference, the accuracy can be improved. If on the premise of performing the finishing processing in the third mode, the acceleration of the heavy ion in the second processing mode can be increased, which increases a processing speed of the second mode. The thickness of the damage layer increases due to the increase in the acceleration, but can be reduced by ion irradiation in the third mode. In this way, both the throughput of the processing and the reduction of the damage caused as a result of the processing can be achieved. In addition, the finishing processing per se is local, and thus the time required for the finishing processing can be reduced as compared with other methods. It is possible to reduce damage to the sample due to unnecessary portions being irradiated with ions for the finishing processing.

However, in the third mode, the acceleration of the ion beam is reduced or the ion mass is increased, which is a disadvantageous condition for ion focusing as compared to other modes. When the sample is applied with a positive voltage, it is difficult for secondary electron signals to reach the secondary particle detector 33, and thus it may be difficult to determine a portion being irradiated with the ions. In such a case, it may be difficult to limit the ion irradiation by the third mode to the processed surface of the second mode alone. In such a case, it is possible to interpose the surface observation of the first mode between the second mode and the third mode, and confirm how the region other than the processed surface of the second mode has changed due to the ion irradiation by the third mode. In this way, for example, when the relative position of the upper layer and the lower layer is measured by comparing or superimposing images before and after the processing using the surface not processed in the second mode as the position reference as shown in the first embodiment, the accuracy can be improved.

Regarding the problem that the secondary electrons do not reach the detector 33 when the sample is applied with a positive charge in the third mode, by performing the observation in the first mode in advance for determining the irradiation position and configuring a deviation amount of the irradiation position of the heavy ion beam in advance depending on whether the sample is applied with a voltage, the ions can be emitted in the third mode to a target position.
<About Modifications of Invention>

The invention is not limited to the embodiments described above, and includes various modifications. For example, the embodiments described above have been described in detail for easily understanding the invention, and the invention is not necessarily limited to those including all the configurations described above. In addition, a part of the configuration of one embodiment can be replaced with the configuration of another embodiment, and the configuration of one embodiment can be added to the configuration of another embodiment. It is possible to add, delete, and replace other configurations for a part of the configurations of each embodiment.

In the above embodiments, the metal of the emitter electrode 11 may be a metal having a body-centered cubic lattice structure or a hexagonal close-packed structure. Examples thereof include metals such as tungsten, tantalum, molybdenum, niobium, rubidium, ruthenium, titanium, and beryllium. Alternatively, the metal of the emitter electrode 11 may be, for example, iridium or tantalum, which has excellent chemical resistance. By using a metal having excellent chemical resistance, an effect of erosion of the emitter electrode 11 by an ionized gas or an impurity gas contained in the ionized gas is prevented, and an effect of stable operation of an ion source is expected. The metal of the emitter electrode 11 may be a single crystal. For example, by selecting an axis having excellent symmetry such as the <111> direction of tungsten as a long axis direction of the emitter electrode 11, atomic-sized protrusions may be easily formed at an end of an emitter electrode.

In the above embodiments, the emitter electrode 11 may be heated in order to terminate the end of the emitter electrode 11 by three or fewer atoms, preferably one atom. Similarly, in order to sharpen the end of the emitter electrode 11, a gas such as O2 or $N_2$ may be introduced into the vacuum chamber 17 while heating the emitter electrode 11. Similarly, in order to sharpen the end of the emitter electrode 11, a gas such as $O_2$ or $N_2$ may be introduced into the vacuum chamber 17 while applying a high voltage between the emitter electrode 11 and the extraction electrode 13. Similarly, the emitter electrode 11 may be formed of a needle containing tungsten as a main component, and may be heated after a noble metal such as iridium, palladium, or platinum is deposited on the surface of the emitter electrode 11.

In the above embodiments, the optical design for irradiating the sample with the ion beam may be changed depending on which performance is to be emphasized. Therefore, the beam irradiation column 7 may be further added with a lens for focusing the ion beam 15, a deflector for deflecting the ion beam 15, and the like as necessary. An order of arrangement may be changed, and any element may be excluded.

In the above embodiments, an example in which the hydrogen ion beam is used for observing the sample and the neon ion beam is used for processing the sample has been described, while the same effect can be exhibited by using element species other than these elements.

In the above embodiments, the ion beam device 1000 can include an electron beam irradiation function unit in addition to the ion beam irradiation function. The electron beam can be used, for example, to obtain an observation image of the sample 31.

REFERENCE SIGN LIST

1: gas field ionization source
11: emitter electrode (emitter tip)
13: extraction electrode
15: ion beam
16: vacuum exhaust unit
17: vacuum chamber
18: emitter electrode drive mechanism
111: high-voltage power source
112: high-voltage power source
151: probe current
161: flow rate adjustment valve 181: emitter electrode drive mechanism controller
3: sample chamber
31: sample
32: sample stage
33: secondary particle detector
34: vacuum pump
37: gas introduction mechanism
371: gas nozzle
374: gas flow rate adjustment valve
376: gas cylinder
38: gas introduction mechanism
381: gas nozzle
384: flow rate adjustment valve
386: gas cylinder
4: refrigerator
41: refrigerator body
412: first stage
413: second stage
415: heat radiation shield
416: heat transfer unit
60: device platform
61: vibration isolation mechanism
62: base plate
7: beam irradiation column
71: focusing lens
711: focusing lens power source
72: aperture
731: first deflector
732: second deflector
733: third deflector
734: fourth deflector
735: first deflector power source
736: second deflector power source
737: third deflector power source
738: fourth deflector power source
76: objective lens
761: objective lens power source
77: vacuum pump
792: calculation device
1000: ion beam device

The invention claimed is:

1. An ion beam device configured to irradiate a sample with an ion beam to observe or process the sample, the ion beam device comprising:
an emitter tip having a needle-shaped end;
an extraction electrode arranged to face the emitter tip and having an opening at a position away from the emitter tip;
a gas supply source configured to supply a gas to the vicinity of the emitter tip;
a voltage source configured to apply a voltage between the emitter tip and the extraction electrode, thereby irradiating the sample with an ion beam from the emitter tip;
a detector configured to detect a secondary electron or a secondary ion emitted from the sample by irradiating the sample with the second ion beam, and
a computer configured to detect a charged particle generated from the sample by irradiating the sample with the ion beam, thereby generating an observation image of the sample, wherein
the gas supply source is configured to supply a gas that contains a first element having a first mass number and a second element having a second mass number larger than the first mass number,
the voltage source is configured to perform a first mode of applying a first voltage to irradiate the sample with a first ion beam generated by ionizing the first element from the emitter tip, and a second mode of processing the sample in a thickness direction by applying a second voltage to irradiate the sample with a second ion beam generated by ionizing the second element from the emitter tip,
the computer is configured to obtain a first observation image of a first shape formed in a first region of the sample,
the voltage source is configured to perform the second mode when the emitter tip irradiates a second region of the sample with an ion beam after the computer obtains the first observation image, thereby forming a first hole reaching a first depth inside the sample in a second region,
the voltage source is configured to perform the first mode on the second region after the first hole is formed,
the computer is configured to obtain a second observation image of a second shape formed in the second region after the first hole is formed by the voltage source performing the first mode on the second region,
the computer is configured to compare the first observation image and the second observation image, thereby obtaining a relative positional relation between the first shape and the second shape,
the computer is configured to compare a first signal pattern of the secondary electron or the secondary ion detected by the detector and a second signal pattern of the secondary electron or secondary ion emitted from a known structure in the sample,
the second signal pattern comprising a plurality of N peaks, each peak corresponding to a different conductor layer of a plurality of N layers of the sample, and
the computer is configured to terminate the second mode when the first signal pattern and the second signal pattern match a predetermined termination condition indicating a depth reaching the Nth layer of the sample.

2. The ion beam device according to claim 1, wherein
the voltage source is configured to perform the second mode when the emitter tip irradiates a third region of the sample with an ion beam, thereby forming a second hole reaching a second depth in the third region,
the voltage source is configured to perform the first mode on an inclusion region including the second region and the third region after the first hole and the second hole are formed, and
the computer is configured to obtain an observation image of the inclusion region, thereby collectively obtaining an observation image at the first depth and an observation image at the second depth.

3. The ion beam device according to claim 1, wherein
the first shape is formed in the first region on a sample surface,
the computer is configured to obtain a third observation image of a third shape formed in a third region on the sample surface,
the voltage application unit is configured to perform the second mode such that an opening of the first hole includes the third region after the calculation unit obtains the first observation image and the third observation image, thereby forming the first hole including the third region,
the voltage source is configured to perform the first mode on the second region after the first hole is formed,
the computer is configured to obtain the second observation image of the second shape formed in the second region by the voltage application unit performing the first mode on the second region, the computer is configured to obtain a first relative positional relation between the first shape and the third shape by comparing the first observation image and the third observation image, the computer is configured to compare the first observation image and the second observation image, thereby obtaining a second relative positional relation between the first shape and the second shape, and the computer is configured to compare the first relative positional relation and the second relative positional relation, thereby obtaining a third relative positional relation between the third shape and the second shape.

4. The ion beam device according to claim 1, wherein the computer is configured to perform alignment between an observation image of a processing region processed using the second mode and an observation image of a non-processing region that is not the processing region.

5. The ion beam device according to claim 4, further comprising:
a display configured to display the aligned observation images in a superposed manner.

6. The ion beam device according to claim 5, wherein the display is configured to display the aligned observation images in different colors from each other.

7. The ion beam device according to claim 4, wherein the computer is configured to measure a relative position of a structural object included in an observation image after the alignment, thereby measuring the relative position under the same coordinate system in the observation image of the processing region and the observation image of the non-processing region.

8. The ion beam device according to claim 1, further comprising:
a beam scanner configured to control an irradiation position of the ion beam emitted from the emitter tip, wherein the voltage source is configured to change a distribution in a plane of the second ion beam in accordance with at least one of an observation image obtained in the first mode;
an observation image obtained in the second mode;
an ion irradiation amount in the second mode; or
the number of times of ion irradiation in the second mode, thereby making a processing depth of the second ion beam uniform in the plane.

9. The ion beam device according to claim 1, wherein
the gas supply source is configured to supply a gas that contains a third element different from the first element and the same as or different from the second element in addition to the first element and the second element, and the voltage source is configured to apply a third voltage to irradiate the sample with a third ion beam generated by ionizing the third element from the emitter tip, thereby performing a third mode of processing the sample in the thickness direction in addition to the first mode and the second mode.

10. The ion beam device according to claim 9, wherein the third element is the same as the second element, and an acceleration voltage in the third mode is a lower acceleration voltage than an acceleration voltage in the second mode.

11. The ion beam device according to claim 9, wherein the third element is different from the second element, and has a third mass number larger than that of the second mass number.

12. The ion beam device according to claim 9, wherein
the third element is the same as or different from the second element, and the voltage applied to the sample in the third mode is larger than the voltage applied to the sample in the second mode.

13. The ion beam device according to claim 9, wherein
the third element is selected such that a first penetration depth of the third ion beam into the sample is smaller than a second penetration depth of the second ion beam into the sample, the ion beam device further comprises a beam scanner configured to control an irradiation position of the ion beam emitted from the emitter tip, and the beam scanner is configured to irradiate an irradiation region on the sample irradiated with the second ion beam or a vicinity region of the irradiation region with the third ion beam, thereby processing the irradiation region or the vicinity region at a penetration depth smaller than that of the second ion beam.

14. The ion beam device according to claim 9, wherein
the third element is selected such that a first penetration depth of the third ion beam into the sample is smaller than a second penetration depth of the second ion beam into the sample, the voltage source is configured to irradiate the second region with the third ion beam after the first hole is formed and before the first mode is performed in the second region, thereby processing the second region at a penetration depth smaller than that of the second ion beam, and the voltage source is configured to perform the first mode on the second region after the second region is irradiated with the third ion beam.

* * * * *